(12) United States Patent
Poplack et al.

(10) Patent No.: US 10,860,763 B1
(45) Date of Patent: *Dec. 8, 2020

(54) DATA ROUTING AND MULTIPLEXING ARCHITECTURE TO SUPPORT SERIAL LINKS AND ADVANCED RELOCATION OF EMULATION MODELS

(71) Applicant: CADENCE DESIGN SYSTEMS, INC., San Jose, CA (US)

(72) Inventors: Mitchell G. Poplack, San Jose, CA (US); Yuhei Hayashi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 789 days.

This patent is subject to a terminal disclaimer.

(21) Appl. No.: 14/863,788

(22) Filed: Sep. 24, 2015

(51) Int. Cl.
*G06F 30/331* (2020.01)
*G06F 9/455* (2018.01)

(52) U.S. Cl.
CPC ........ *G06F 30/331* (2020.01); *G06F 9/45508* (2013.01)

(58) Field of Classification Search
CPC .................. G06F 17/5027; G06F 9/45508
USPC .......................................................... 703/26
See application file for complete search history.

(56) References Cited

U.S. PATENT DOCUMENTS

| 4,277,827 | A | 7/1981 | Carlson et al. |
| 4,785,416 | A | 11/1988 | Stringer |
| 5,249,266 | A | 9/1993 | Dye et al. |
| 5,712,806 | A | 1/1998 | Hennenhoefer et al. |
| 5,819,097 | A * | 10/1998 | Brooks ................. G06F 8/447 717/141 |
| 5,943,490 | A | 8/1999 | Sample |
| 6,298,370 | B1 * | 10/2001 | Tang ..................... G06F 9/5044 718/100 |
| 6,473,727 | B1 | 10/2002 | Kirsch et al. |
| 6,574,590 | B1 | 6/2003 | Kershaw et al. |
| 6,598,155 | B1 | 7/2003 | Ganapathy et al. |
| 6,680,874 | B1 | 1/2004 | Harrison |
| 7,904,288 | B1 | 3/2011 | Beausoleil et al. |
| 7,913,206 | B1 * | 3/2011 | Cadouri ............. G06F 17/5081 716/106 |
| 8,438,549 | B1 | 5/2013 | McCoy et al. |
| 8,959,010 | B1 | 2/2015 | Bershteyn et al. |
| 9,292,640 | B1 | 3/2016 | Elmufdi et al. |
| 2001/0010036 | A1 | 7/2001 | Stewart et al. |
| 2001/0020224 | A1 | 9/2001 | Tomita |

(Continued)

*Primary Examiner* — Saif A Alhija
(74) *Attorney, Agent, or Firm* — Foley & Lardner LLP

(57) ABSTRACT

Disclosed herein are systems and methods of compiling resources of a programmable emulation system to execute an emulation process, to emulate a logic system, such as an application-specific integrated circuit (ASIC), currently being tested and prototyped, and then revising, transforming, and moving the compiled instructions sets to inexpensively, quickly, and dynamically adapt to unavailable resources, which may be due to previously allocation to a different emulation job, or for fault tolerance. Relocation of the resources that will execute the emulation job (i.e., "footprint") may refer to the remapping of a compiled footprint to a revised set of resources, defining a revised footprint. Fault tolerance may refer to support for working around faulty hardware components of the emulation system.

30 Claims, 11 Drawing Sheets

(56) References Cited

U.S. PATENT DOCUMENTS

| | | | |
|---|---|---|---|
| 2002/0073398 A1* | 6/2002 | Tinker | G06F 8/65 |
| | | | 717/110 |
| 2003/0056134 A1 | 3/2003 | Kanapathippillai et al. | |
| 2005/0267732 A1 | 12/2005 | Beausoleil et al. | |
| 2006/0190237 A1 | 8/2006 | Beausoleil et al. | |
| 2008/0235002 A1* | 9/2008 | Cohen | G06F 9/45504 |
| | | | 703/26 |

* cited by examiner

FIG. 9

DATA ROUTING AND MULTIPLEXING ARCHITECTURE TO SUPPORT SERIAL LINKS AND ADVANCED RELOCATION OF EMULATION MODELS

CROSS-REFERENCE TO RELATED APPLICATIONS

This application is related to U.S. application Ser. No. 14/921,424, entitled "Multiphase I/O for Processor-Based Emulation System," filed Oct. 23, 2015, which is incorporated by reference herein in its entirety.

TECHNICAL FIELD

This application relates generally to integrated circuit design and testing systems, methods, and products; sometimes referred to as logic system design emulation.

BACKGROUND

Emulation chips may comprise hardware components capable of processor-based (i.e., hardware-based) emulation of logic systems, such as application specific integrated circuits (ASICs), central processing units (CPUs), graphics processing units (GPUs), and the like. By executing various forms of programmable logic, the emulation chips may be programmed to mimic the functionality of nearly any prototype logic system design that is undergoing testing. This allows logic system designers to prototype their logic system design using processor-based emulation before needing to actually manufacture the logic system, such as an ASIC product.

Emulation systems may receive a netlist file containing the logical gate structure in of the prototype the design of a logic system, such as an ASIC. The emulation system may compile that netlist file into virtual logic representing the logical gates, which may be used to program the various modules or processors of the emulation system. In conventional emulation systems, after the netlist is compiled, the resulting virtual logic is mapped to particular components of the emulation system, thus a recompile is necessary to shift which components of the emulation system should execute which portions of the compiled virtual logic. Problematically, the recompiling the netlist can take several hours or even days.

What is needed is a means to dynamically track status of the various resources of the emulation system to be able to dynamically adapt the compiled instructions or virtual logic. What is also needed is a means for dynamically adapting the virtual logic or instructions, after compilation, such that the different components or resources of the emulation system could be used to execute the various processes and tasks of the emulation process job, depending upon current availability of resources.

SUMMARY

Disclosed herein are systems and methods of compiling resources of a programmable emulation system to execute an emulation process, to emulate a logic system, such as an application-specific integrated circuit (ASIC), currently being tested and prototyped, and then revising, transforming, and moving the compiled instructions sets to inexpensively, quickly, and dynamically adapt to unavailable resources, which may be due to previous allocation to a different emulation job, or for fault tolerance. Relocation of the resources that will execute the emulation job (i.e., "footprint") may refer to the remapping of a compiled footprint to a revised set of resources, defining a revised footprint. Fault tolerance may refer to support for working around faulty hardware components of the emulation system.

In one embodiment, a processor-implemented method for executing programmatic logic compiled for a first processor of an emulation system, the method comprising: receiving, by a second processor of the emulation system, an instruction set compiled for the first processor, the instruction set comprising one or more instructions having one or more parameter values updated based on the second processor; executing, by the second processor of the emulation system, a first instruction in the instruction set according to the one or more parameter values of the first instruction; and transmitting, by the second processor, an output bit to a destination processor according to a first parameter value of the first instruction.

In another embodiment, a processor-implemented method for executing programmatic logic compiled for a first processor of an emulation system, the method comprising: receiving, by a second processor of the emulation system, an instruction set compiled for the first processor, the instruction set comprising one or more instructions having one or more parameter values changed based on the second processor; selecting, by the second processor, according to a first parameter value of the first instruction, an input bit from a plurality of inputs received by the second processor; and executing, by the second processor, the first instruction in the instruction set according to the one or more parameter values of the first instruction.

In another embodiment, a circuit emulation system comprises at least two emulation processing circuits, each respective emulation processing circuit comprising: one or more clusters of one or more processors, each respective processor comprising a logic function multiplexer coupled to a processor instruction store configured to store a set of processor instructions; a first multiplexer including a first instruction store configured to store a set of first instructions, the first multiplexer in electrical communication with each cluster of the emulation processing circuit, and configured to route data from a first cluster to a second processor, based upon a first instruction in the first instruction store; and a second multiplexer including a second instruction store configured to store a set of second instructions, the second multiplexer in electrical communication with the first cluster and configured to route data to a third processor based upon a second instruction in the second instruction store, the third processor in a second emulation processing circuit of the at least two emulation processing circuits; and a third multiplexer including a third instruction store configured to store third instructions, the third multiplexer in electrical communication with one or more processors, the third multiplexer configured to receive from a plurality of clusters a plurality of data inputs containing data, and based upon a third instruction: select a data input and route the data to the one or more processors coupled to the third multiplexer.

In another embodiment, a computer-implemented method comprises determining, by a computer executing a configuration module of an emulation system, a resource status of one or more respective resources of the emulation system, for each respective resource in a set of one or more resources associated with an instruction set that is configured for the respective resource; and responsive to the computer identifying at least one resource having an unavailable status as an unavailable resource in the set of one or more resources:

revising, by the computer, one or more instruction parameters of the instruction set associated with the unavailable resource, for each respective unavailable resource.

In another embodiment, an emulation system comprises a plurality of computing resources, wherein at least one resource is a multiplexer configured to execute one or more instructions of an instruction set configured for the multiplexer, and wherein at least one resource is the instruction memory coupled to the multiplexer, the instruction memory comprising non-transitory machine-readable memory configured to store the instruction set configured for the multiplexer; and a configuration module executed by a computing device, the configuration module configured to determine a resource status for each respective resource in the emulation system, and, in response to identifying an unavailable resource associated the multiplexer, revise one or more parameters values of the instruction set configured for the multiplexer.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

FIG. 9 shows schematic diagrams of possible footprints of resources of an emulation system.

DETAILED DESCRIPTION

Figure 1A:
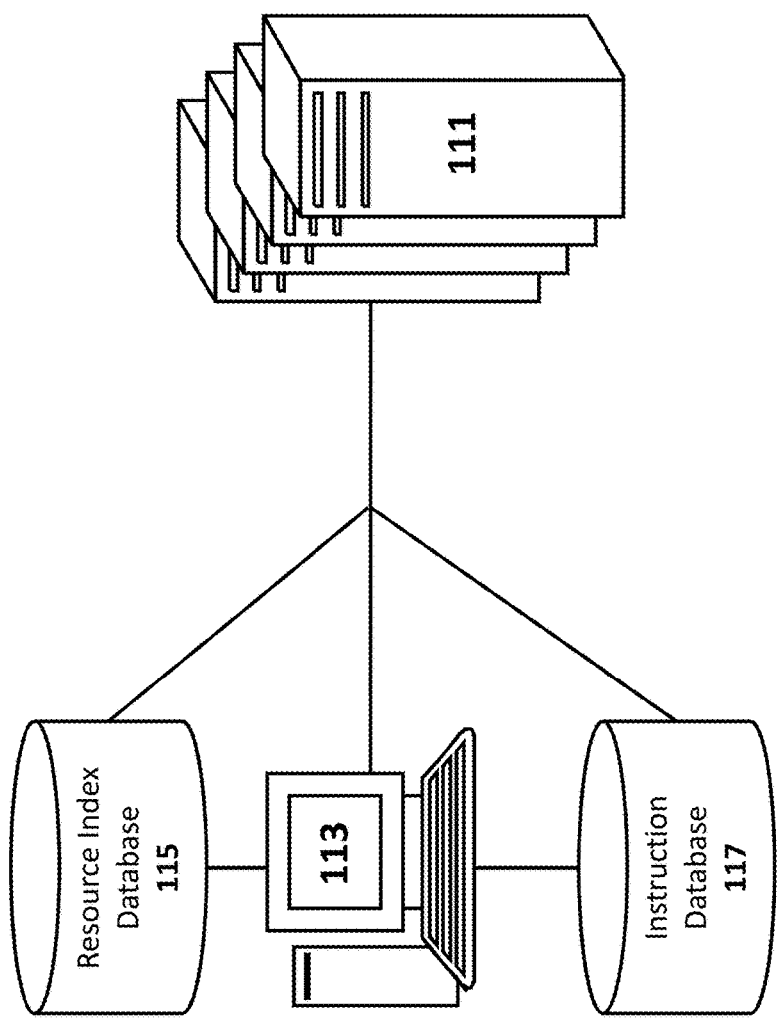
FIG. 1A is a schematic diagram showing components of an emulation system.

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Reference will now be made to the exemplary embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to one skilled in the relevant art and having possession of this disclosure, are to be considered within the scope of the invention.

Components of an Exemplary Emulation System

Exemplary Emulation System

FIG. 1A shows components of an emulation system 100, according to an exemplary system embodiment. The exemplary system 100 may comprise emulation devices 111, a host device 113, a resource index database 115, and an instruction database 117.

Emulation devices 111 may be a collection of computing hardware capable of executing the emulation processes described herein. An emulation device 111 may comprise racks housing emulation logic boards, emulation processors, and other computing hardware designed to emulate the designs of prototype application-specific integrated circuits (ASICs) and/or other logic systems. In some embodiments, emulation devices 111 may comprise a server computer having separate processors, which may execute software modules configured to manage and control the resources and performance of the emulation system 100. Non-limiting examples these software modules may include a complier module and a configuration manager.

A compiler may be a software module, which may be executed by a host device 113 or on an emulation device 111, and is configured to receive and compile a netlist design file containing the logical gate design of an ASIC or other logic system and then generates a virtual logic file based on the compiled netlist. In other words, the compiler must "map" the ASIC's (or other logic system's) logic into the hardware components of the emulation system 100, to generate instructions for the system's 100 components to behave as the ASIC or other logic system would. The compiler module may comprise a partitioner and scheduler component or function, though it should be appreciated that the compiler may be segmented into any number of component software modules. In an opening import phase, the compiler receives the netlist and begins compiling. Here, the compiler may parse the logic gates of the netlist into a database format. A partitioner may determine which part of the netlist is going to be executed by which type of hardware resource of the system 100, and which instance. Then, a scheduler may determine for that part of the netlist which of the hardware resources should execute the part of the netlist and when in the execution cycle that logic component (e.g., gate, instruction) should be executed. The compiler may be capable of determining the status of components of the system 100, including the allocation status of particular components or whether the resource is inoperable (i.e., marked-out). In some cases, the compiler tracks this in a memory of the device executing the compiler 111, 113; and, in some cases, the compiler may query a resource index database 115 that stores status data.

A configuration manager may be software module, which may be executed by a host device 113 or a emulation device 111, and is configured to track the status and control the task performed of components of the system 100. The configuration manager may determine which components of the system 100 are available or unavailable to receive parts of the virtual logic generated by the compiler. In some cases, the configuration manager continuously polls or self-tests the emulation system 100 for faulty hardware components.

The configuration manager may then update records of the components stored in a resource index database 115. In some cases, the configuration manager may determine the status of components of the system 100 when the virtual logic is being loaded into the hardware components of the emulation system 100. The determination may be based on querying a resource index database 115 or other stored file containing data about the status of hardware components (e.g. mark-out list). In some embodiments, the configuration manager may determine whether the instructions of the virtual logic should be revised (i.e., moved, transformed) from the instructions that were originally compiled. The configuration manager may be configured to automatically make this determined, or may receive instructions from an administrator through a GUI, command-line interface, or other type of user interface, to review and revise the complied instructions.

In some cases, these software modules may be executed in whole or in part on a host device 113, such as an administrator or user computer, which may communicate data and instructions associated with the respective software module to and from the emulation device 111. For example, in some cases, the host device 113 may execute a compiler module that allows a user to input a netlist design file, containing logic gate designs of the prototype ASIC or other prototype logic system, and then compiles the netlist file. The resulting virtual logic may then be transmitted or downloaded to an emulation device 111, and may execute a configuration manager module configured to track the availability of resources within the emulation system 100. It should be appreciated that the host device 113 may be any computing device comprising a processor and non-transitory machine-readable storage that render the host device 113 capable of performing the various tasks and processes described herein. Non-limiting examples of host devices 113 may include workstation computers, laptops, tablets, server computers, and the like.

An instruction database 117 may store records of virtual logic or instruction sets compiled by the compiler from netlist files. The instruction database 117 may be hosted in non-transitory machine-readable storage medium of any computing device capable of hosting the instruction database 117 and performing the various tasks and processes associated with the instruction database 117, as described herein. The instruction database 117 may receive, from a device executing the compiler 111, 113, instructions compiled from the netlist file of an ASIC or other logic system. In some cases, the instructions may be contained within a virtual logic file generated by the compiler. At download time, when the emulation system's 100 hardware components are loaded with the instructions, the instruction database 117 may transmit or otherwise provide the instructions to the components, at which point the emulation devices 111 receive the instruction sets and the instruction sets are loaded into the memories of the respective hardware components within the racks housing the emulation logic boards.

A resource index database 115 may be a database or a machine-readable computer file (e.g., mark-out list) containing records for components of the emulation system 100. The resource index database 115 or similar resource may be hosted in non-transitory machine-readable storage medium of any computing device capable of hosting the resource index database 115 and performing the associated tasks and processes described herein. The records may indicate various types of status information about components, such as allocation status, availability status (e.g., busy, broken, incompatible), execution status (e.g., busy, idle), and the like. The resource index database 115 may be periodically updated by modules of the system (e.g., configuration manager) or manually by a user, using a host device 113. The resource index database 115 may also be queried by modules throughout the emulation process.

Figure 1B:
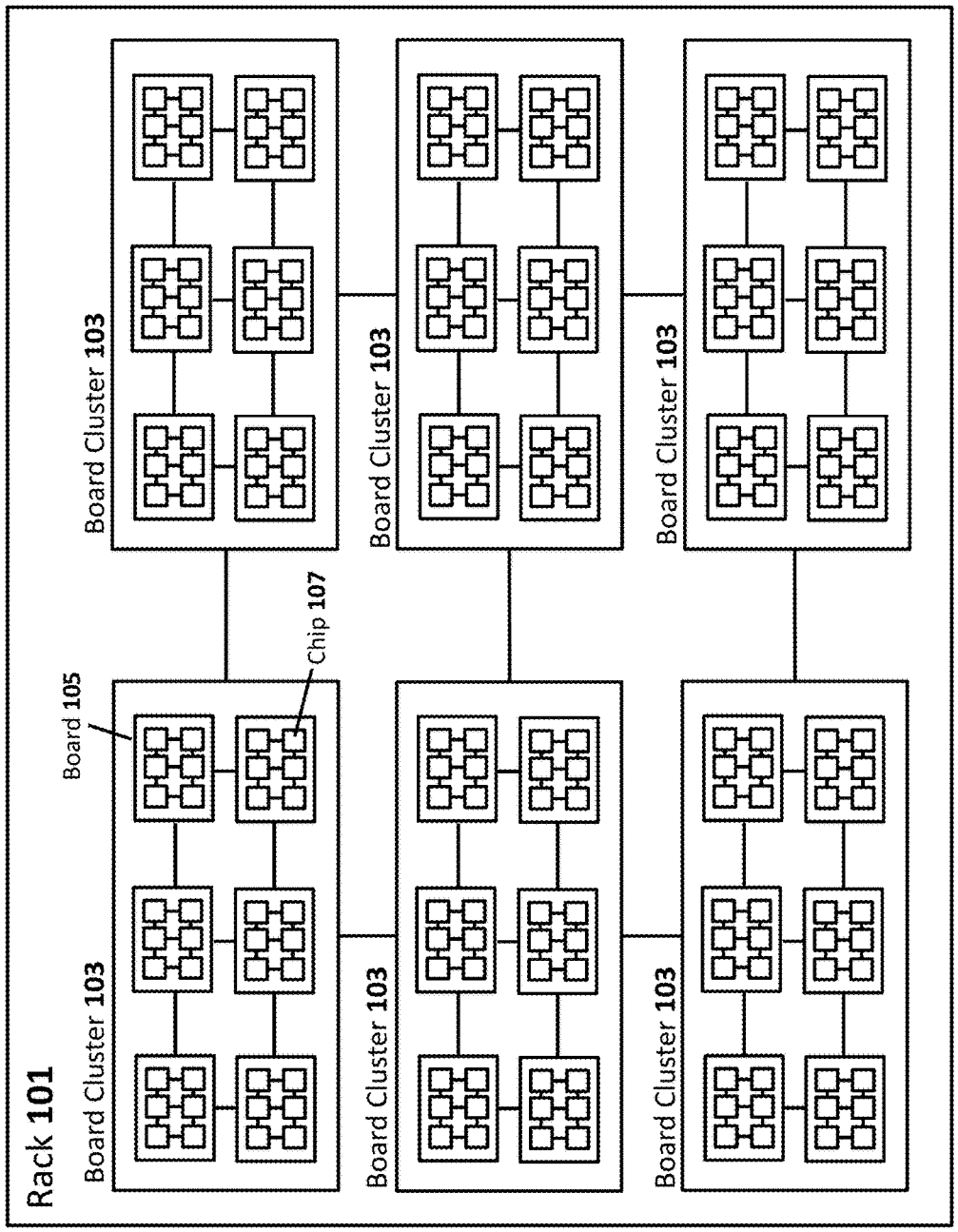
FIG. 1B is schematic diagram showing the possible hierarchical configuration of the exemplary emulation system.

FIG. 1B is a diagram showing just one possible hierarchical configuration of components of emulation devices 111, according to the exemplary emulation system 100 shown in FIG. 1. An emulation device 101 of an emulation system 100 may comprise racks 101, board clusters 103, logic boards 105, emulation chips 107, and buses of various types carrying data signals between the various components of the emulation system 100.

A rack 101 may be any physical housing for components of an emulation system 100. In the exemplary system 100, the rack 101 houses a plurality of emulation logic boards 105 that are organized into board clusters 103. In the exemplary system 100, there is only one rack 101, however some other embodiments may comprise a plurality of racks 101. In some cases, the rack 101 may be a computing device, such as a server computer or workstation computer, configured to implement various emulation functions. The rack 101 may physically house components of any type, such as board clusters 103, emulation logic boards 105, emulation chips 107, and buses hosting data signal communications.

Board clusters 103 may be logical and/or physical collectives of one or more logic boards 105. Logic boards 105 may be clustered for any number of reasons, such as creating proximity among a set of boards 105 for more efficient signal transfer and processing between the boards 105 of the cluster 103. It should be appreciated that clustering logic boards 105 is often a design consideration, and, as such, other embodiments may cluster and/or disaggregate logic boards 105 according to any number of different organizational patterns. As shown in FIG. 1, the exemplary system 100 comprises six board clusters 103, each of the board clusters 103 comprises six logic boards 105. The board clusters 103 may be interconnected with one another by buses, which may carry data signals transmitted to and from the board clusters 103. Likewise, buses may interconnect the logic boards 105 of a particular board cluster 103, so that the logic boards 105 may transmit and receive data signals to and from other logic boards within the same board cluster 103.

Emulation logic boards 105 comprise computing hardware components capable of emulation functionality to emulate the design and functions of an ASIC or other circuitry; non-limiting examples of emulated logic systems might include application-specific integrated circuits (ASICs), central processing units (CPUs), graphics processing units (GPUs), and arithmetic processing units (ALUs), among others. The logic board 105 may comprise one or more emulation chips 107 performing the functions needed for emulation, and one or more buses interconnecting the emulation chips 107. The buses may be an optical, copper, or any other conductive material capable of carrying data signals. In operation, the buses may carry data signals transmitted to and from the emulation chips 107 of the logic board 105. In some cases, the logic board 105 may comprise one or more buses supporting communication between emulation chips 107 on the same logic board 105 (i.e., intra-board communication); and, in some cases, the logic board 105 may comprise one or more buses supporting communication between emulation chips 107 located on other logic boards 105 of the system 100 (i.e., inter-board communication).

Emulation chips 107 may comprise any number of processors capable of performing the various tasks and processes for emulating an ASIC or other logical processing circuitry, multiplexers configured to direct data signals to and from the processors, buses for communicating data between the processors, and data lanes connecting the components of a processor. An emulator chip 107 may be designed to mimic the functionality of any ASIC or other logic system design, based on programmable logic that configures the emulator chip's 107 behavior to mimic the particular ASIC. In this way, circuitry designers may prototype new ASIC designs using processor-based emulation, before actually manufacturing the ASIC and emulation device 111. The emulation chips 107 may receive a set of instructions to execute from a compiler, which may be a software module component executed by a computing device coupled to the system 100. In operation, the compiler compiles a netlist file representing the ASIC's design. The result of compiling the netlist generates virtual logic comprising instruction sets for the components (e.g., multiplexers, Boolean processors) of the emulator chips 107.

In some embodiments, the processors of the emulator chip 107 may be organized into any number of processor clusters (not shown) to efficiently share data inputs, data outputs, and data references (e.g., calls to stored data in a data array). For example, multiple processors of an emulator chip 107 may be clustered together such that the processors reference the same data array and/or instruction store. It should be appreciated that, due the modular nature of the components of the system 100, components like the processors may be organized into any number of additional or alternative organizational patterns. In some cases, clusters of processors may be clustered into clusters of clusters. However, it should be appreciated that organizational patterns are not required, and thus, in some embodiments, processors of an emulations chip 107 may not be organized into clusters at all.

Emulation Chips

Emulation chips disclosed herein are capable of performing programmatic logic functions used for hardware-based (i.e., processor-based) logic system emulation, which may allow for prototyping ASICs or other logic systems before actual production of the particular ASIC or logic system product. During execution of an emulation test, this programmatic logic may be executed by processors of emulation chips.

Emulation Processors

Figure 2:
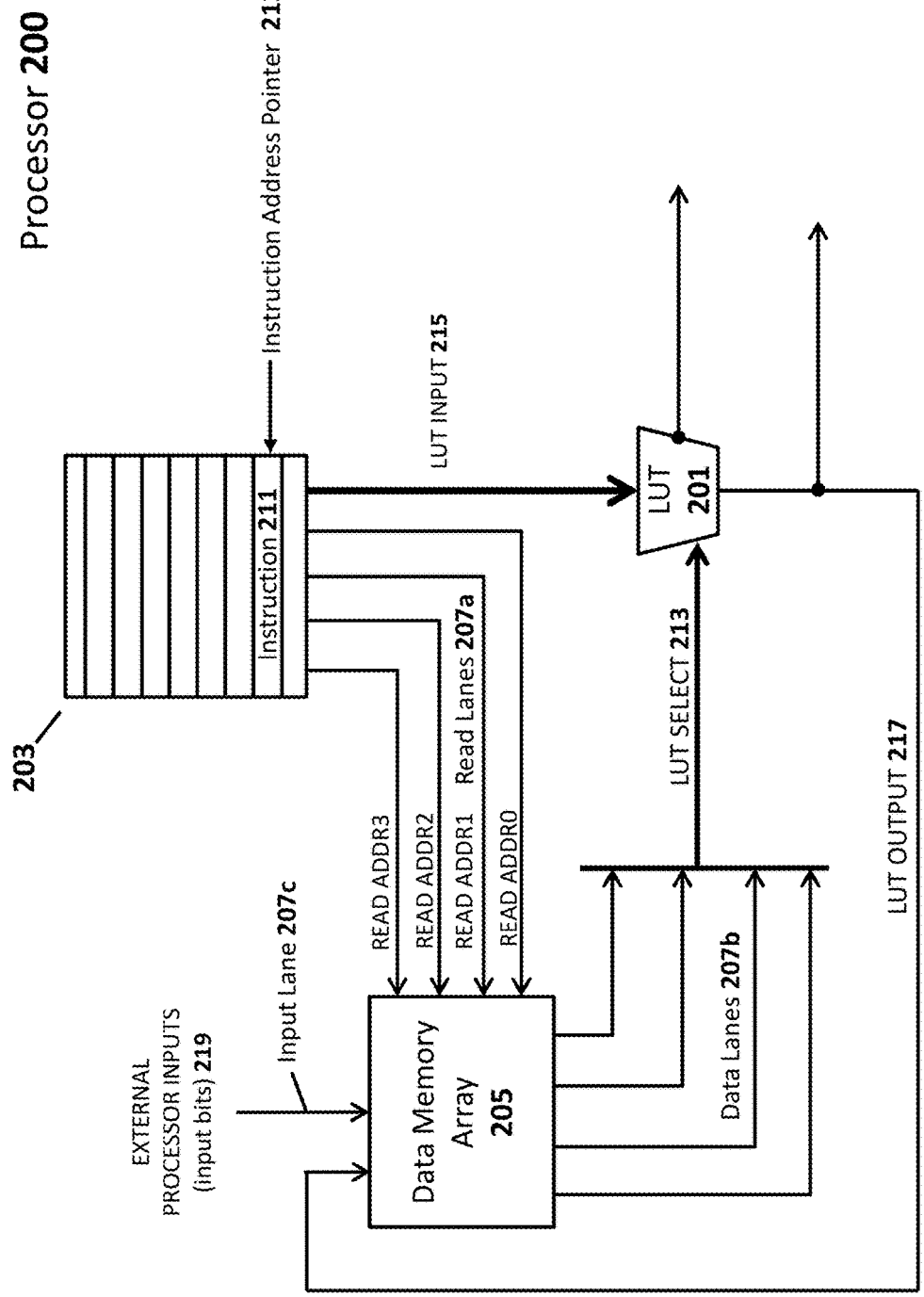
FIG. 2 shows components of a processor within an emulation chip, according to an exemplary system embodiment.

FIG. 2 shows components of a processor 200 within an emulation chip, according to an exemplary system embodiment. A processor 200 may comprise a lookup table (LUT) 201, an instruction memory 203, and signal lanes 207 connecting the components of the processor 200 to one another and to external processors. In operation, a processor 200 may sequentially read instructions 211 from a corresponding instruction memory 203 associated with the processor 200 that stores instructions for the processor 200 to execute. An instruction 211 may contain bits that may be used by the processor 200 to determine which bits should be read from a data memory array 205 or other input source. The bits read from the data memory 205 may then be fed to a LUT 201, which may be a particular type of multiplexer controlled by the current instruction 211. The result of a LUT 201 performing its various functions may produce an output bit. In some cases, this output bit may then be transmitted along a LUT output lane 207 to the data memory 205 for storage. In these cases, the data memory 205 may store any number of output bits resulting from any number of previous LUT 201 evaluations. Additionally or alternatively, the data memory 205 may receive over a processor input lane 207, input bits arriving from a bit source external to the processor 200, including bits transmitted from other processors 200. In other words, the LUT 201 not only has access to previous results of the processor 200 stored in the data memory 205, but the LUT 201 may also access values (e.g., input bits) from outside the processor 200.

A LUT 201 may be a circuit multiplexer (MUX) configured to represent (i.e., execute or otherwise perform) any Boolean function, thus allowing the emulation of most any function that could be produced by the logic system (e.g., ASIC, CPU, GPU, ALU) currently being emulated. A LUT 201 may comprise one or more circuit crossbars, which may comprise a set of one or more switches. It would be appreciated by one skilled in the art that the switches of the LUT 201 crossbars may be configured as a series of circuitry interconnects, which may be enabled or disabled according to a transistor or other component, such that the switches of the crossbar may select inputted data signals, perform logical functions on the selected data signals, and output data signals, when the transistor enables or disables certain interconnects. An instruction set, stored in an instruction memory 203, may provide instructions to the circuitry of the LUT's 201 crossbars. In many cases, the Boolean functions capable of being executed by the LUT 201 have the same number of inputs (i.e., function parameters) as the number of select inputs leading into the LUT 201. For example, the LUT 201 shown in FIG. 2 may be a so-called "four-way" MUX that has four data inputs but only two select inputs. As such, by varying the values received from the four data inputs, the LUT 201 may allow the processor 200 to emulate any Boolean function requiring two bits. Likewise, the size of the Boolean functions that can be emulated using the LUTs 201 can be increased or decreased by adding or removing the number of select inputs fed into the LUTs 201. For example, in some embodiments, processors 200 of an emulation chip may comprise LUTs 201 with four inputs (i.e., "LUT4"), which allows each of these processors 200 to perform any four-bit Boolean function. However, it should be appreciated that there is no limitation upon the number of select inputs that are associated with the LUTs 201 of an emulation chip.

An emulation chip may further comprise an instruction memory 203, which may be a non-transitory machine-readable storage media configured store a set of instructions 211 for the processor 200 to use for performing emulation functions. The emulation system may compile machine-readable code containing the functions of the logic system being emulated. The result of compilation is virtual logic containing the programmatic logic representing the functional designs of the emulated ASIC or other logic system. After compilation, the virtual logic is parsed into various instruction sets that may be distributed, or "downloaded," into the various instruction memories 203 of the emulation chips. During compilation, the instruction sets were generated with the expectation that the instruction sets will be provided to specific processors 200 or MUXs. As such, in many cases, the instruction sets are downloaded into predetermined instruction memories 203 according to the input and output destinations of the respective instructions 211 of each instruction set. Upon compiling a netlist file representing the design of the logic system (e.g., ASIC, CPU, GPU) being tested, the resulting instruction set may be stored into the instruction memory 203, where each instruction 211 is stored into an individual memory address within the instruction memory 203. An instruction address pointer 213 may identify each respective instruction address on behalf of processor 200, such that the processor's 200 components may retrieve and execute each individual instruction 211. In some embodiments, the processor 200 may be configured to sequentially execute each instruction 211, using an instruction address pointer 213. In such embodiments, the instruction address pointer 213 may be incremented as each sequential instruction 211 is executed by the processor's 200 components.

The processor 200 may be associated with a data memory 205 comprising non-transitory machine-readable storage media configured to store one or more input and/or output data bits. In some cases, the data memory 205 may be a component of the processor 205. In some cases, the data memory 205 may be communicatively coupled to a plurality of processors 200, such that the data memory 205 is accessible by a cluster of processors 200. The data memory 205 may store results of the processor's 200 evaluations (i.e., LUT 201 function output), or inputs to the processor 200 from external sources (e.g., external processors). As shown in FIG. 2, the data memory 205 may comprise a number of single-bit read (i.e., input) ports, often equal to the number of select inputs of the processor (in this example, there are four). The data memory 205 may also have "write" ports, such as the write port to write the result of a LUT 201 evaluation, or the write port to receive processor inputs from external sources. The data memory 205 may store a number of emulation steps that correspond to a clock-cycle of the ASIC, or other logic system, being emulated. The data stored in the data memory 205 may represent the state of the emulated ASIC or other logic system.

Processor Clusters

As mentioned previously, in some embodiments, multiple processors may be clustered together into processor clusters containing any number of processors. Clustering may facilitate expansion of the capabilities of the emulation system because the processors may have limitations on the number of logic system gates the processors can emulate. In some cases, clusters 300 may be more efficient in prototyping functions of the logic system, such as an ASIC, because of the increased processing power and functionality. For example, a single processor may be able to emulate, at most, 1,280 logic gates (i.e., logical processes), but the ASIC or other logic system currently being tested has several million gates, all of which need to be emulated for proper circuit function and thorough testing. In some embodiments, clusters 300 of processors may be clustered into "clusters of clusters." Clustered processors communicate with each other by sending their LUT evaluations out to other processors in the cluster 300.

Figure 3:
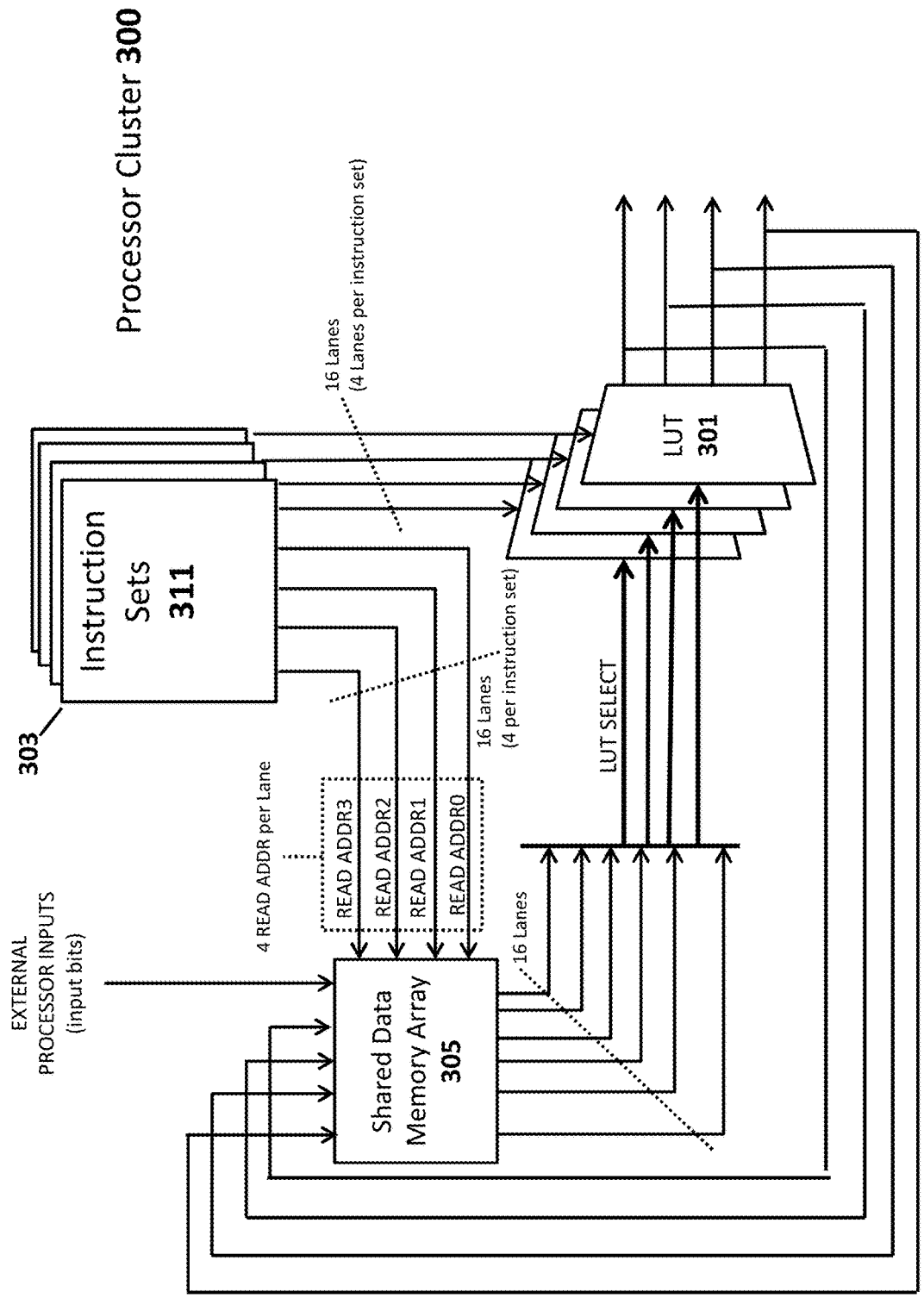
FIG. 3 shows an exemplary processor cluster comprising a cluster of four processors.

FIG. 3 shows an exemplary processor cluster 300 comprising a cluster of four processors. A processor cluster 300 may often comprise one or more multiplexers 301 that share a common memory array 305 or other some other resource. In some cases, clusters 300 may be capable of performing increasingly more complex logical functions. As such, clusters 300 may be capable of prototyping increasingly more complex functions of a logic system (e.g., ASIC, CPU, GPU). Like with individual processors 301, the exemplary processor cluster 300 of an emulation chip comprises any number of multiplexers 301 that perform simple Boolean computations, according to a control logic program or simple set of logical rules, which may be in an instruction memory 303 as instruction sets 311. In the cluster 300, however, the multiplexers 301 may share a single data array memory 305, and may also output larger results to the same destination resource. This allows for the cluster 300 to emulate more intricate functions of the prototyped logic system, such as an ASIC, because more bits may be processed, stored, or output, thus more complex functions may be modeled.

It should be appreciated that clusters of processors 300 for a given emulation chip may be formed into any organizational structure, and that nothing described herein should be construed as limiting on the possible organizational structure of the resources. In some cases, for example, clusters may be clustered, thereby forming clusters of clusters.

Global Multiplexers, Output Multiplexers, and Input Multiplexers

An emulation chip may comprise multiplexers residing outside of an emulation chip's processors (i.e., in addition to the LUTs). These multiplexers may allow for connections between outputs or inputs of certain resources, such as processors, clusters of processors, and serial buses.

Figure 4:
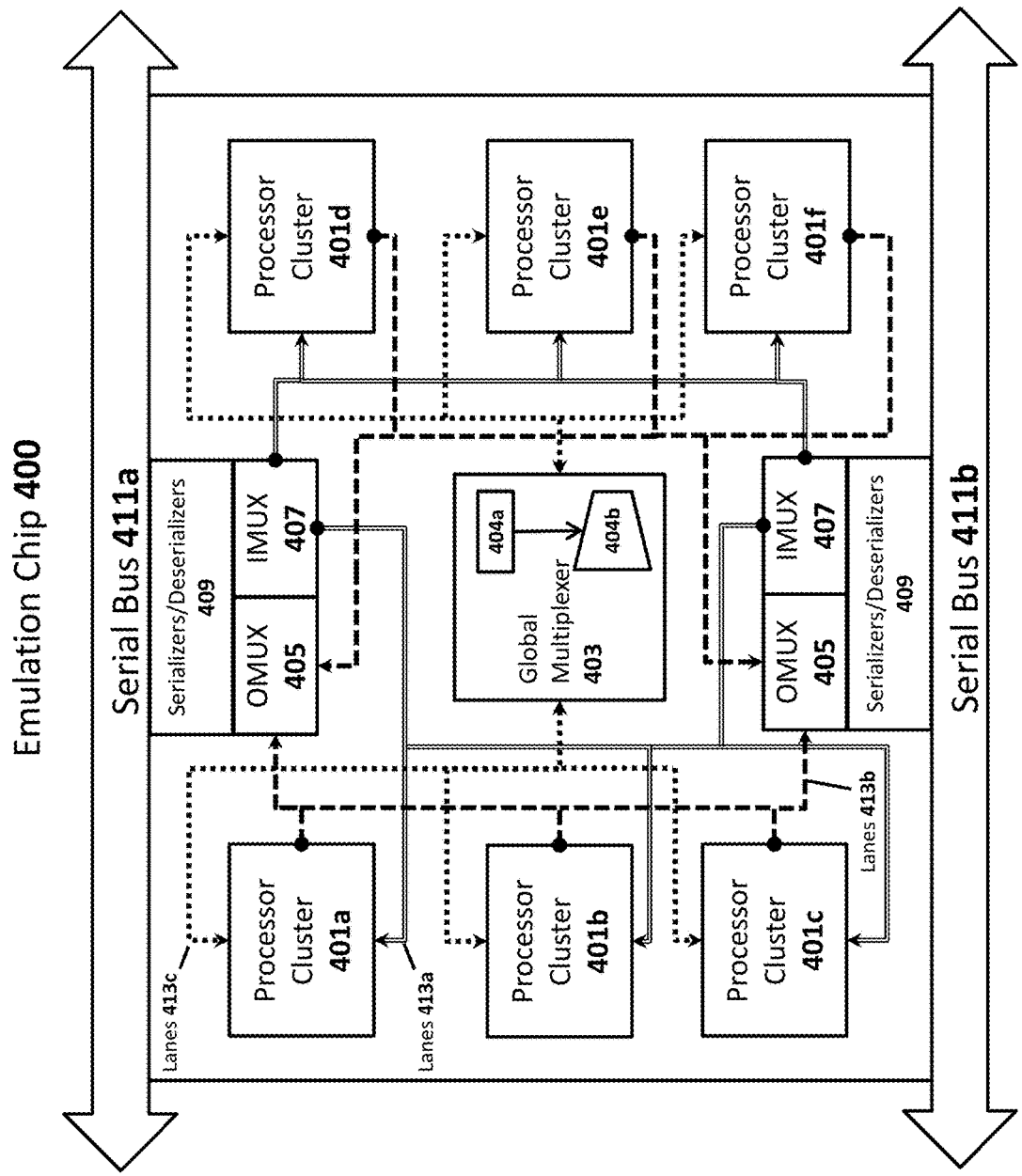
FIG. 4 shows a schematic diagram of an emulation chip, according to an exemplary embodiment.

FIG. 4 shows a schematic diagram of an emulation chip 400, according to an exemplary embodiment. The exemplary emulation chip 400 may comprise processor clusters 401, a global multiplexer 403 (GMUX 403), output multiplexers (OMUXs 405), input multiplexers (IMUXs 407), serializer-deserializers 409, and serial buses 411. In operation, processor clusters 401 may produce and transmit a set of one or more bits (represented by data signals) over the chip's 400 data lanes to the GMUX 403; the GMUX 403 may, in turn, forward the one or more bits to a destination resource, which may be a processor cluster 401 or a particular processor on the chip 400. In some cases, the destination may be located on a second emulation chip. In such cases, data may be transmitted to an OMUX 405 configured to connect the processors or clusters 401 of the emulation chip 400 to a serial bus 411 that connects a number of emulation chips 400. Additionally or alternatively, in some cases, a cluster 401 or a processor of the emulation chip 400 may receive data from a different emulation chip, via the serial bus 411. In such cases, the data may be received by an input multiplexer (IMUX 407), which may also be configured to connect the processors or clusters 401 of the emulation chip 400 to a serial bus 411. It should be appreciated that the functions and features described in this exemplary embodiment may be varied, such that additional or alternative features may include, or the features and functions may be aggregated into a fewer multiplexers, or disaggregated into additional multiplexers.

A processor cluster 401 may be a collection of one or more processors performing various logical functions associated with emulating an ASIC, or other logic system, currently being prototyped by the emulation system. Each processor cluster 401 may comprise any number of processors, or clusters of clusters. For example, in some embodiments, a cluster 401 may comprise a single processor; and, in some cases, the cluster 401 may comprise, e.g., four or eight processors. In some embodiments, processor cluster 401 may comprise a cluster of clusters. For example, eight clusters 401 may be clustered with eight other clusters 401, to form a cluster 401 of sixty-four processors. It should be appreciated that a chip 400 may comprise multiple clusters 401, each of which may have the same or different clustering pattern. In some embodiments, the processors of a cluster 401 may each execute instructions from a dedicated instruction set (i.e., an instruction set per LUT), which means that each processor may produce its own output bits. In such embodiments, the processor cluster 401 may further comprise a processor output multiplexer (not shown), which may determine the set of bits ultimately output by the processor cluster 401. The resulting output bits from a cluster 401 may then be transmitted to a GMUX 403 or an OMUX 405.

A processor cluster 401 may be interconnected to other clusters 401 by parallel data lanes 413, serial buses 411, or any combination of the two. Data lanes 413 and serial buses 411 may comprise any material (e.g., copper, fiber optics, gold) capable of being a medium for transmitting data signals between clusters 401, or other resources of the chip 400 (e.g., memories). In operation, the data lanes 413 and serial buses 411 may be the medium used for transmitting a set of one or more bits (i.e., data represented by the data signals) between clusters 401 and multiplexers 403, 405, 407. After performing Boolean functions, a cluster 401 produces logical results (i.e., one or more output bits), which the cluster 401 may transmit to a destination resource (e.g., memory, multiplexer) according to the instruction set or sets associated with that cluster 401. For example, after performing a series of Boolean functions, a cluster 401a may determine to, based on the instruction sets of that cluster 401a, transmit the output bits to a data memory array (not shown) for that cluster 401a, or the cluster 401a may transmit the output bits to another processor or cluster 401b in the emulation system.

Data lanes 413 may comprise any material capable of hosting transmitted data signals between component resources of the emulation chip 400. Although the data lanes 413 are shown in FIG. 4 as a single line, it should be appreciated that there may be any number of parallel data lanes 413 interconnecting components of the chip 400. Such parallel data lanes 413 may transmit a number of data signals into a single multiplexer 403, 405, 407, which the multiplexer 403, 405, 407 may then use to execute certain dynamic routing functions according to the multiplexer's 403, 405, 407 instruction set.

Serial buses 411 may comprise any material capable of transmitting data signals to from processor clusters 401 to destinations in the emulation system that are not located on the chip 400, such as a second emulation chip, an external memory drive, a second logical board (different from the logical board housing the emulation chip 400), or any other computing resource of the emulation system that is not housed on the emulation chip 400. In the exemplary embodiment, the emulation chip comprises multiple serial buses 411—a first serial bus 411a configured to transmit a processor cluster's 401 outputted data signals to other emulation chips (not shown) on the same logical board (not shown), and a second serial bus 411b configured to transmit a processor cluster's 401 outputted data signals to other emulation chips (not shown) on a different logical board (not shown). Serial buses 411 may be configured to convey outputted data signals in a serialized configuration. That is, data signals outputted from processor clusters 401 may arrive at the serial bus 411 via parallel data lanes 413. These data signals may then be organized into streams of data, as opposed to parallel data lanes 413, which is then transmitted over the serial bus 411 to the appropriate destination.

A global multiplexer (GMUX 403) may be responsible for interconnecting clusters 401 or processors on the emulation chip 400, thereby facilitating data signal exchanges between the clusters 401. For example, the GMUX 403 may receive data inputs, outputted from a number of clusters 401a-f, and then, based on the instruction set informing GMUX's 403 behavior, the GMUX 403 may select a data value from the inputs received from, e.g., a first cluster 401a, which the GMUX 403 then drives back into the same first cluster 403a or onward to a second cluster 403b. In some implementations, this is the main technique by which processors within each cluster 401 communicates data to other processors within the same or different clusters 401. Although the exemplary embodiment comprises a GMUX 403 that routes data signals between processor clusters 401 found on the same emulation chip 400, it should also be appreciated that, in some embodiments, a GMUX 403 may be configured to route data signals from processor clusters 401 to an OMUX 405 or IMUX 407 of the emulation chip 400, thereby allowing the GMUX 403 to influence data-routing to and from other emulation chips (not shown).

The GMUX 403 may comprise a GMUX instruction store 404a and a multiplexer crossbar 404b. The GMUX instruction store 404a may be a non-transitory machine-readable storage medium configured to store a set of instructions that control the GMUX's 403 operation. In some cases, the instructions may be downloaded to the GMUX instruction store 404a from an instruction database (not shown) at download time, or distributed directly by a compiler module or a configuration module. The instruction set stored in the GMUX instruction store 404a may control the logical behavior of the GMUX crossbar 404b. In operation, the GMUX crossbar 404b may, based on the instructions in the GMUX instruction store 404a, select a set of one or more inputs from the data signals received from one or more processor clusters 401, perform zero or more operations on the inputs, and output data (i.e., transmit a data signal) to a destination cluster 401 or processor. Although, FIG. 4 shows an emulation chip 400 having only one GMUX, 403, it should be appreciated that, in some embodiments, an emulation chip 400 may comprise zero or more GMUXs 403.

An OMUX 405 may be responsible for routing data signals from processor clusters 401 of the emulation chip 400 to destination resources in the emulation system not housed on the emulation chip 400. In some cases, such data signal routing uses a serial bus 411, such that the OMUX 405 may route data signals from processors to the serial bus 411. The OMUX 405 may execute its routing functions based on an OMUX instruction set stored in an OMUX instruction store (not shown); these OMUX 405 functions may include receiving data from processor clusters 401 through parallel data lanes 413, selecting a set of one or more input bits from the data signals received from the clusters 401, performing one or more operations using the bits received in the data signals from the clusters 401, outputting data signals to processor clusters 401, outputting data signals to serial buses 411, and serializing data bits into a data stream when the bits are received as parallel data signals through parallel data lanes 413. In some embodiments, the OMUX 405 may comprise a serializer 409, which may be a function of the OMUX 405 or a second multiplexer crossbar that is also a component of the OMUX 405. In such embodiments, the serializer 409 function or multiplexer may be responsible for outputting a data stream to a serial bus 411. That is, the serializer 409 feature of the OMUX 405 provides the OMUX 405 with the ability to receive parallel bits, through parallel data lanes 413, and then output an ordered data stream comprising the appropriate bits of data. In some embodiments, the serializer 409 may be distinct multiplexer component of the emulation chip 400. In such embodiments, the OMUX 405 may output a set of bits to the serializer through parallel data lanes 413, where the serializer 409 will then generate a data stream for transmission over a serial bus 411.

An IMUX 407 may be responsible for routing data signals from source resources in the emulation system that are not housed on the emulation chip 400, to destination resources on the emulation chip 400 (e.g., processor clusters 401). In some cases, the data signals arrive at the IMUX 407 through a serial bus 411, which may host data streams of serialized bits transmitted between emulation chips 400 or emulation logic boards. The IMUX 407 may, based on an IMUX instruction set stored in an IMUX instruction memory (not shown), receive data bits of a data stream from a serial bus 411, perform any number of logical operations on the data bits of the data stream, generate a set of output bits, output parallel data signals containing the set of bits, and route the parallel data signals to clusters 401 or specific processors on the emulation chip 400. As mentioned, the IMUX 407 may execute its logical operations and routing functions based on an IMUX instruction set stored in an IMUX instruction store (not shown). In some embodiments, the IMUX 407 may comprise a deserializer 409, which may be a function of the IMUX 407 or a second multiplexer crossbar that is also a component of the IMUX 407. In such embodiments, the deserializer 409 function or multiplexer may be responsible for outputting a set of bits in the form of parallel data signals through parallel data lanes 413. That is, the deserializer 409 function or feature of the IMUX 407 provides the IMUX 407 the capability to receive a data stream of serialized bits, through a data base 411, and then output parallel data signals containing bits of data. In some embodiments, the deserializer 409 may be distinct multiplexer component of the emulation chip 400. In such embodiments, the IMUX 407 may receive a data stream of serialized bits, then, based on an instruction set of the IMUX 407, generate a set data signals, and output the set of data signals to processor clusters 401 or a GMUX 403 through parallel data lanes 413.

It should be appreciated that multiplexers (e.g., GMUX 403, OMUX 405, IMUX 407) are generally not interconnected to each other by data lanes 413, and thus multiplexers generally do not share data lanes 413. For example, an IMUX 407 generally receives data bits for processors or processor clusters 401 from processors of another chip via a group of dedicated data lanes 413*a*, an OMUX 405 generally transmits from processors or processor clusters 401 to processors of other resources of another chip via a group of dedicated data lanes 413*b*, and a GMUX 403 generally transmits between processors or processor clusters 401 on the chip 400 via a group of dedicated data lanes 413*c*.

Figure 5:
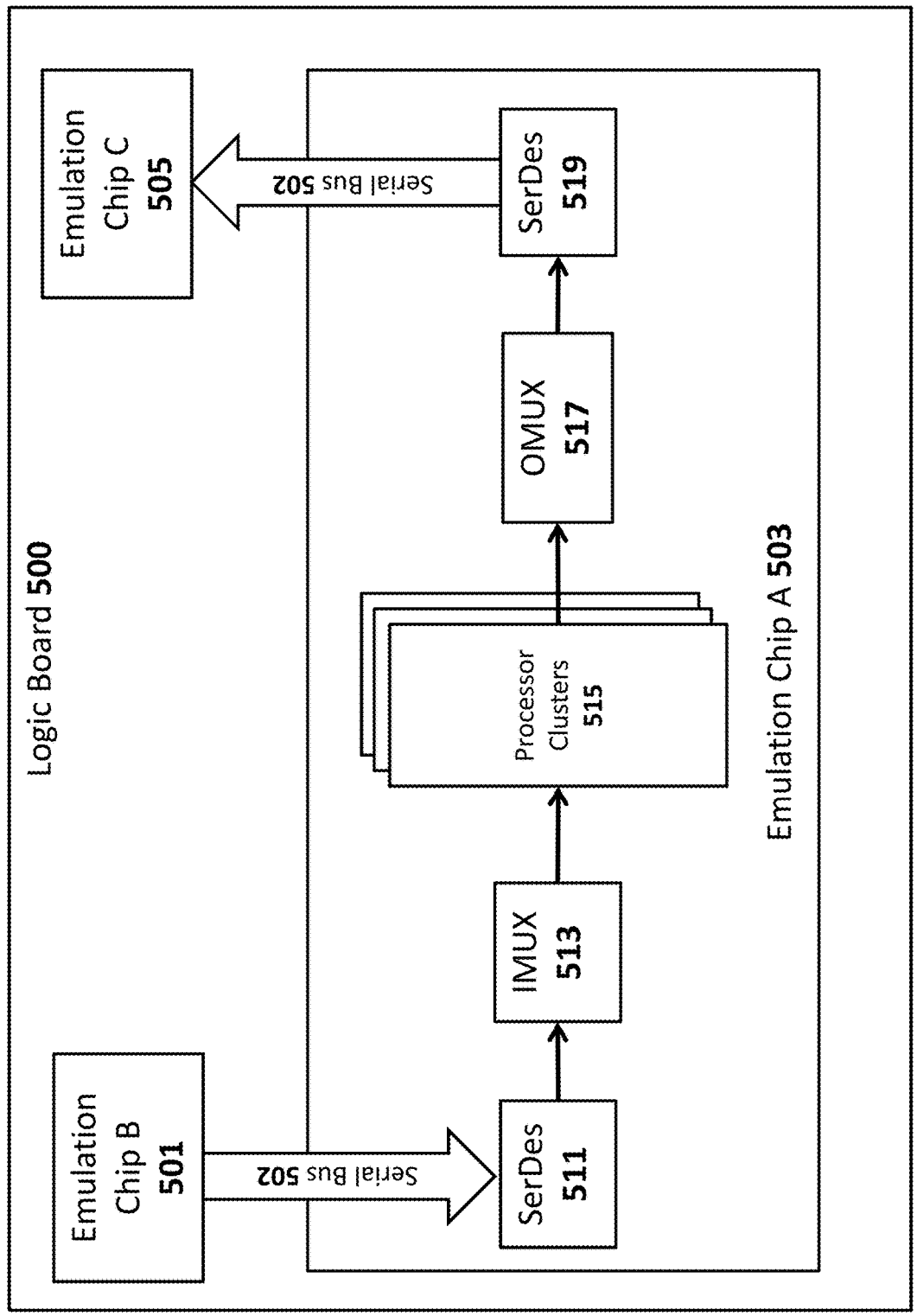
FIG. 5 shows the logical data flow between components of an emulation logic board of an emulation system, according to an exemplary embodiment.

FIG. 5 shows the logical data flow between components of an emulation logic board 500 of an emulation system, according to an exemplary embodiment. In the exemplary emulation logic 500, a stream of data bits are transmitted over a serial bus 502 between emulation chips 501, 503, 505 of the logic board 500. A first emulation chip 503 receives a data stream, through the logic board's 500 serial bus 502, from a second emulation chip 501. The first emulation chip 503 may perform various features and functions, and may eventually output data over the serial bus 502 to a third emulation chip 505 of the logic board 500.

A serializer-deserializer (SerDes) 511 feature of the emulation chip 503 may receive the data stream from the serial bus 502 and then output parallel data signals over parallel data lanes of the emulation chip 503. The data signals may represent data bits, which are received by an IMUX 513. The IMUX 513 may receive data signals from any number of emulation chips 501, 503, 505, which may include emulation chips on a second logic board (not shown), and then a multiplexer crossbar of the IMUX 513 may, based on an IMUX instruction set, select one or more of the inputs, perform zero or more logical functions on the inputs, and then route the resulting IMUX outputs to an appropriate processor cluster 515.

Similarly, processor clusters 515 may perform various logical functions representing an ASIC, or other logic system, currently being tested by the emulation system. The clusters 515 may output data bits in the form of data signals to an OMUX 517. In some embodiments, the processor clusters 515 may comprise any number of processor output multiplexers (not shown), which may be intermediate multiplexers for aggregating outputted data of several clusters 515 or performing additional logical function emulations, before the processor cluster 515 output is routed to a third emulation chip 505 via the OMUX 517. The OMUX 517 may, based on an OMUX instruction set, select one or more of the inputs received from any number of processor clusters 515 of the emulation chip 503, perform zero or more logical functions on the inputs, and then route the data to a SerDes 519 component, which may serialize the set of bits outputted by the OMUX 517. That is, the OMUX 517 may generate a set of output bits that are routed in parallel to the SerDes 519, where the SerDes 519 may then produce a data stream of serialized data bits, for transmission to the third emulation chip 505 over the serial bus 502.

Output Multiplexers (OMUX)

Figure 6:
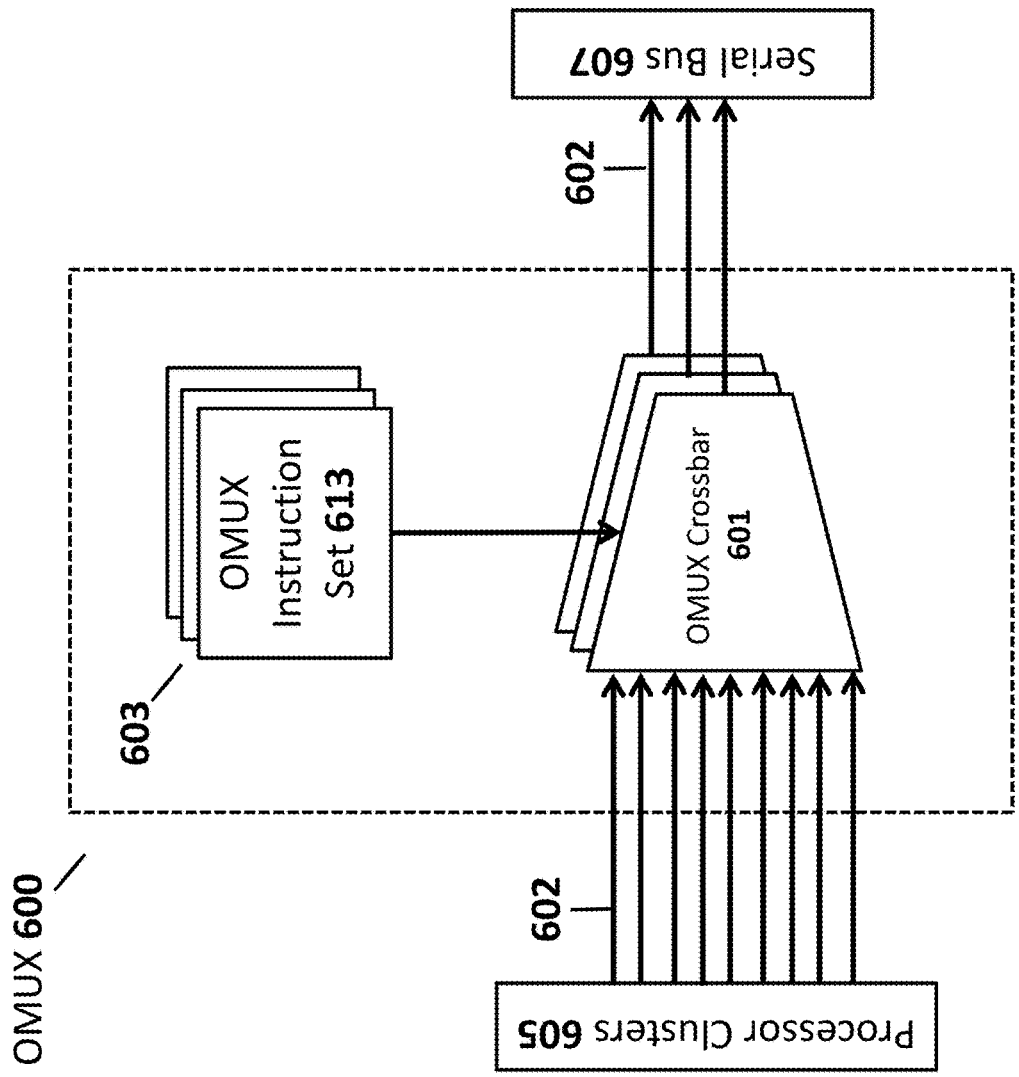
FIG. 6 shows a schematic diagram representing an OMUX, according to an exemplary embodiment.

FIG. 6 shows a schematic diagram representing an OMUX 600, according to an exemplary embodiment. An OMUX 600 may comprise crossbars 601, parallel data lanes 602, and instruction memories 603. In operation, the OMUX 600 may receive data signals over data lanes 602 from processor clusters 605, perform various functions based on an OMUX instruction set 613, and then transmit the results as data signals over data lanes 602 to a serial bus 607.

An OMUX 600 may comprise one or more OMUX crossbars 601, which may comprise a set of one or more switches. It would be appreciated by one skilled in the art that the switches of the crossbar 601 may be configured as a series of circuitry interconnects that may be enabled or disabled according to a transistor or other component, such that the switches of the crossbar may select inputted data signals, perform logical functions on the selected data signals, and output data signals, by the transistor enabling or disabling certain interconnects. An OMUX instruction set 613, stored in an OMUX instruction memory 603, may provide instructions to the circuitry of the OMUX crossbars 601. For example, the OMUX crossbars 601 may receive multiple data signals from a plurality of processor clusters 605 through the parallel data lanes 602. The OMUX 601 may select the appropriate inputs, as dictated by the instructions of the instruction set 613, and then route a set of outputs to the serial bus 607. In some cases, the OMUX crossbar 601 may function as a chokepoint, selecting only a handful of processor cluster 605 outputs to then forward to the serial bus 607. In some cases, the OMUX crossbar 601 may aggregate the bits of the inputted data signals, or parse out a subset of the bits from the inputted data signals, based on the instructions of the instruction set 613. In some cases, the OMUX crossbar 601 may perform logical functions using the inputted data bits. The OMUX crossbar 601 may then route through the parallel data lanes 602 the output data signals to a destination resource of a different emulation chip. In some cases, data routed to destination resources on a different emulation chip may be transmitted via a serial bus 607. In some embodiments, the OMUX 600 may comprise a serializer function that may be performed by the OMUX crossbar 601. In some embodiments, the OMUX crossbar 601 may route outputted signals to a serializer component associated with the serial bus 607.

The OMUX instruction memory 603 may be a non-transitory machine-readable storage medium configured to receive and store an instruction set 613 from a database (not shown) of the emulation system. The database may store instructions sets in any format (e.g., compiled virtual logic)

after the instructions sets are compiled from the netlist. That is, after compiling the netlist, the emulation system may store instruction sets into a database. During a "download" time, instruction memories, such as the OMUX instruction memory 603, may download or otherwise receive the instruction set 613 compiled for the particular crossbar 601. The OMUX instruction set 613 may contain instructions for the OMUX crossbar 601 to select data signal inputs, perform any number of functions on the data bits represented by the data signals, and route the resulting output data signals to a predetermined destination resource. An OMUX 600 may interconnect processor clusters 605 of different emulation chips. In this role, the instructions may contain the predetermined destination resource on a different emulation chip, or the instructions may inform the OMUX crossbar 601 on how to determine the appropriate destination resource. The OMUX 600 may then route the data signals from the processor clusters 605 to the appropriate destination resource, which may require the OMUX 600 to route the data signals to an intermediary serial bus 607 that is configured to carry data transmissions between chips.

An OMUX crossbar 601 may be configured as a "partial" crossbar, which one having skill in the art would appreciate to be a cross-wiring matrix having only a subset of the wiring being interconnected by the matrix. As previously described, the OMUX 600 may be configured to drive outputted data signals produced by a cluster 605; and because the OMUX crossbar 601 is a partial crossbar, many or all of the processor outputs of the processors within a cluster 605 can be re-arranged (i.e., sent to different destinations) in a direct or indirect manner. In some embodiments, the processor outputs are divided into processor output source groups that correspond to groups of lanes that carry data, e.g., between chips on the same board, and between chips having the same "chip number" in a different board cluster, among other possible destinations for a group of data lanes. In such embodiments, since a source group determines which lanes processor outputs are to be routed, each processor output associated with a particular group is to be resolved for each of the available I/O slots for each appropriate lane in that corresponding group. For this reason, it is not necessary to route all processor outputs to all lanes, and thus the OMUX crossbars 601 may be a partial crossbar and be sufficiently effective in footprint re-location (i.e., easily swapped out, easily adapted to a newly defined footprint).

The interconnected data lanes are designed to allow a signal from any processor to be routed as quickly as possible to any lane, though not always any I/O slot. When it is desired to route a signal to a particular destination (such as a potentially newly-defined destination), it is irrelevant which I/O slot that signal occupies. As a result, when the emulation system wants to route a signal from one chip to another, the emulation system does not need to consider which I/O slot in the serial word (e.g., instruction of instruction set 613) the resulting outputted data signal would occupy. As a result, the emulation system may devise a mapping (or re-mapping) of processors, the I/O slots, and data lanes, which does not need a full crossbar OMUX 600 that may be expensive and/or slower than a partial crossbar OMUX 600.

Input Multiplexers

Figure 7:
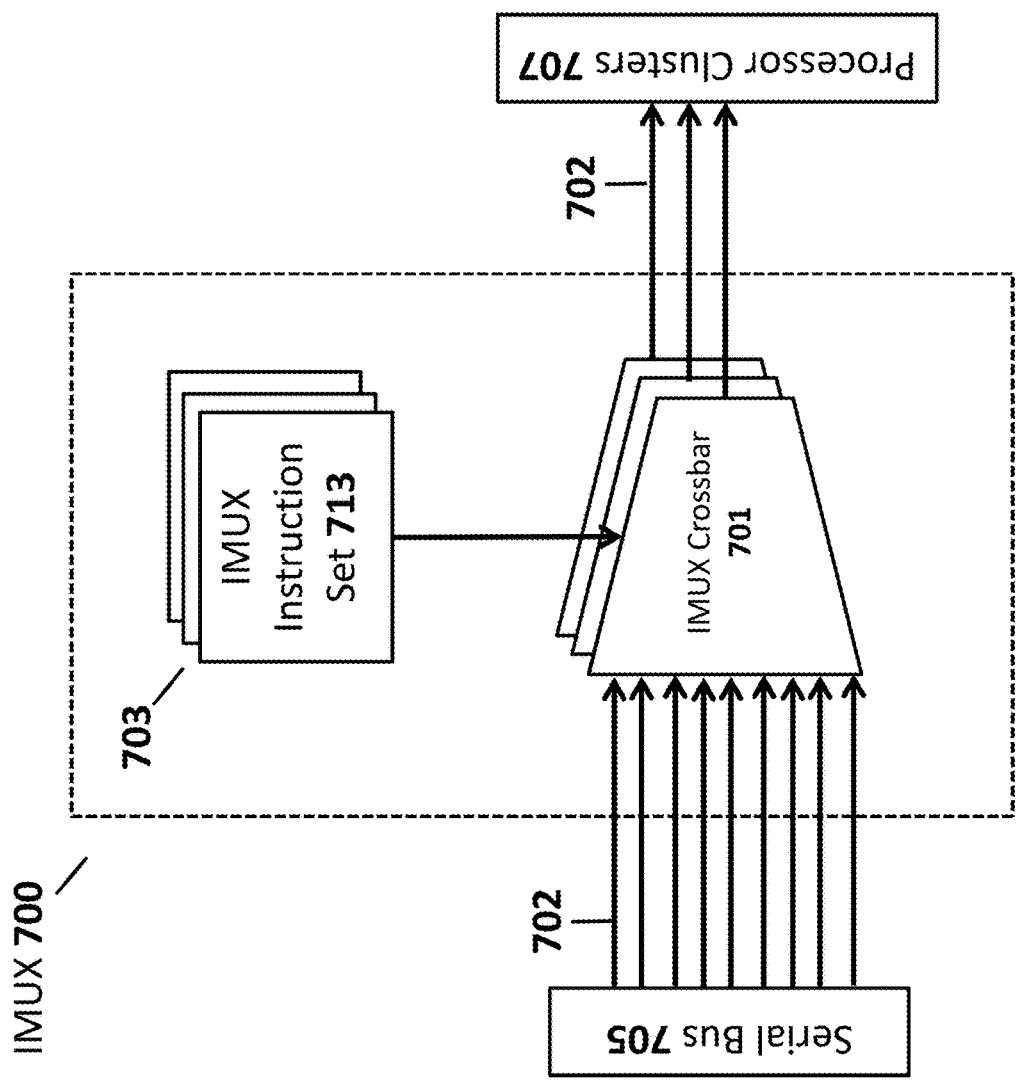
FIG. 7 shows a schematic diagram representing an IMUX, according to an exemplary embodiment.

FIG. 7 shows a schematic diagram representing an IMUX 700, according to an exemplary embodiment. An IMUX 700 may comprise IMUX crossbars 701, parallel data lanes 702, and instruction memories 703. In operation, the IMUX 700 may receive serialized bits as a data stream over a serial bus 705 from a different emulation chip, perform various functions based on an IMUX instruction set 713, and then transmit the results as data signals over data lanes 702 to processor clusters 707 of the emulation chip.

An IMUX 700 may comprise one or more IMUX crossbars 701, which may comprise a set of one or more switches. It would be appreciated by one skilled in the art that the switches of the crossbar 701 may be configured as a series of circuitry interconnects that may be enabled or disabled according to a transistor or other component, such that the switches of the crossbar may select inputted data signals, perform logical functions on the selected data signals, and output data signals, by the transistor enabling or disabling certain interconnects. An IMUX instruction set 713, stored in an IMUX instruction memory 703, may provide instructions to the circuitry of the IMUX crossbars 701. For example, the IMUX crossbars 701 may receive multiple data signals from any number of emulation chips (not shown) through a serial bus 705, which may arrive at the IMUX crossbars 701 directly from a serial bus 705, or the inputs may be received by the IMUX crossbars 701 through parallel data lanes 702 after the data streams are deserialized. The IMUX crossbars 701 may select the appropriate inputs, as dictated by the instructions of the instruction set 713, and then route a set of outputs to the processor clusters 707 of the emulation chip. In some cases, the IMUX crossbars 701 may function as a chokepoint, i.e., selecting only a handful of inputs to then forward to the processor clusters 707. In some cases, the IMUX crossbars 701 may, based on the instructions of the IMUX instruction sets 713, aggregate the bits of the inputted data signals or parse out a subset of the bits from the inputted data signals. In some cases, the IMUX crossbars 701 may perform logical functions using the inputted data bits. The IMUX crossbars 701 may then route, through the parallel data lanes 702, output data signals to a destination processor cluster 707. In some embodiments, the IMUX 700 may comprise a deserializer function that may be performed by the IMUX crossbars 701. In some embodiments, the IMUX crossbars 701 may receive inputted signals from a deserializer component associated with the serial bus 705.

The IMUX instruction memory 703 may be a non-transitory machine-readable storage medium configured to receive and store an IMUX instruction set 713 from a database (not shown) of the emulation system. The database may store instructions sets in any format (e.g., compiled virtual logic) after the instructions sets are compiled from the netlist. That is, after compiling the netlist, the emulation system may store instruction sets into a database. During a "download" time, instruction memories, such as the IMUX instruction memory 703, may download or otherwise receive the IMUX instruction set 713 compiled for the particular crossbar 701. The IMUX instruction set 713 may contain instructions for the IMUX crossbars 701 to select data signal inputs, perform any number of functions on the data bits represented by the data signals, and route the resulting output data signals to a predetermined destination resource. An IMUX 700 may interconnect processor clusters 707 of different emulation chips. In this role, the instructions in the IMUX instruction set 713 may contain the predetermined destination processor cluster 707 of an emulation chip, which will be the destination for an input received by the IMUX 700 from a different emulation chip, or the instructions may inform the IMUX crossbars 701 on how to determine the appropriate destination processor cluster 707.

The IMUX 700 may then route the data signals from the serial bus 705 to the appropriate destination processor clusters 707.

An IMUX crossbar 701 may be a so-called "full" crossbar, which one having skill in the art would appreciate to be a cross-wiring matrix having each incoming lane being interconnected within the matrix. As previously described, the IMUX 700 may be configured to drive inputted data signals arriving off-chip, via a bus connecting chips (e.g., serial bus 705); and because the IMUX crossbar 701 is a full crossbar, all of the processor inputs arriving from other chips can be re-arranged in a direct access manner, as needed. In other words, because the IMUX crossbar 701 may be a full crossbar, data arriving from any source can be routed to any processor or processor cluster 707, but also the IMUX crossbar 701 may reroute data arriving from a different source to the same processor if the particular data lane is "swapped" according to the instruction set 713. Because the full crossbar within the IMUX crossbar 701 can reroute data to any resource, including a different destination (than what was originally expected during compilation), and the emulation system does not have to recompile the entire netlist, the emulation system may simply modify certain instructions or instruction sets 713 to account for the updated destination.

Relocation of Compiled Resource Footprint

An emulation system may test the design of a logic system prototype by emulating the features and functions of the particular logic system (e.g., ASIC, CPU, GPU) being tested. The emulation system may be hardware system that may be repurposed (i.e., reconfigured) to emulated different logic system products. The components of the emulation system responsible for logical processing and data routing, and thus responsible for emulating the processing gates of an ASIC or other logic system, may contain a number of multiplexers and processing elements of various types. The multiplexers comprise one or more circuit crossbars and an instruction set memory. The crossbars operate by enabling and disabling circuitry lanes according to an associated set of instructions stored in the instruction set memory of the multiplexer. These instructions are generated by a compiler, based on a netlist file that contains the logical gate design for the logic system (e.g., ASIC, CPU, GPU). When the netlist is compiled by the emulation system, a set of instructions is generated as virtual logic and then mapped to various multiplexers and processing elements of the emulation system. The instruction sets (i.e., virtual logic) may then be stored into a logic database of the emulation system, until download time. At download time, when a user indicates that the emulation system should execute or be initialized, the instruction sets are downloaded from the logic database into the instruction set memories of the appropriate multiplexers and processing elements of the emulation system.

As mentioned herein, a compiler module may compile a netlist file containing design logic (e.g., logic gates, terminals, connections) of an ASIC or other logic system undergoing testing. In some circumstances, the netlist may be in the form of a hardware description language, such as Verilog HDL, or VHDL. Compiling the netlist may result in the compiler generating a machine-readable virtual logic file containing executable instructions. Manual or automated processes of the emulation system may parse and distribute this virtual logic to the various components of the emulation system (e.g., processors, instruction memories, multiplexers, data memories). The processors may then download and store the distributed portions of the virtual logic in the form of instruction sets. Individual instructions within the virtual logic may be compiled to indicate how resources (e.g., processors, multiplexers) should behave. Typically, each instruction comprises a predefined set of fields that inform the behavior of a resource executing the particular instruction; non-limiting examples of fields may include an input selection field, an operation field, and a destination field. The addresses indicated in the input selection fields and the destination fields of compiled instructions may define the conceptual boundaries of an execution footprint, which may be conceptual representation of the system resources involved with executing compiled virtual logic. The compiler or other software module of the emulation system may then distribute the respective instruction sets to the appropriate resources, which receive and download, or otherwise store, the instruction sets into a non-transitory machine-readable storage memory (e.g., instruction memory) associated with the particular resource (e.g., processor, MUX).

Figure 8:
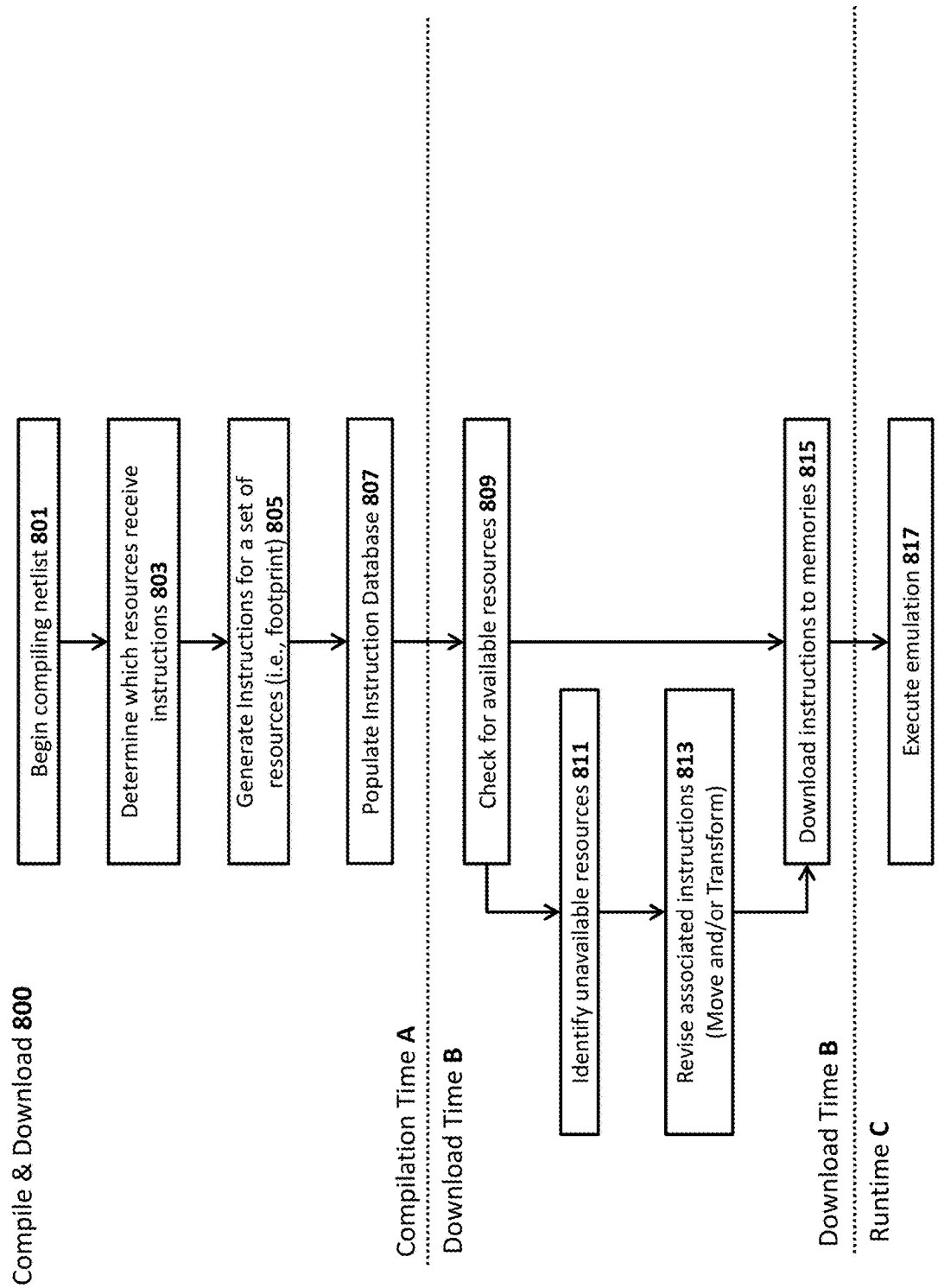
FIG. 8 shows execution of an exemplary method of compiling instructions associated with a set of resources of the emulation system and then relocating the footprint to encompass an adjusted set of resources.

FIG. 8 shows execution of an exemplary method 800 of compiling instructions associated with a set of resources (i.e., "footprint") of the emulation system and then relocating the footprint to encompass an adjusted set of resources. The emulation system may function in a number of stages. In the exemplary method 800, the emulation system is broken into compilation time A, download time B, and runtime C (i.e., execution of the emulation). During compilation time A, a design netlist for a prototype logic system is compiled into virtual logic comprising a number of instruction sets that are configured for certain resources in the emulation system. At download time B, the system may distribute the instruction sets to the appropriate memories. The emulation system may then execute the emulation during runtime C.

In a first step 801, the emulation system begins compiling a netlist file containing a machine-readable representation of the logic gates in the design of the prototype ASIC or other logic system. In some cases, this may be an automated process that may be triggered by an event, such as receiving a netlist file from a second computer or uploaded using a graphical user interface (GUI). In some case, compilation may be begin by a user selection, through a GUI, instructing the system to begin compiling the netlist file. In this step 801, a computing device executing a compiler module may compile the netlist file into a machine-readable virtual logic file that, when completed, contains instruction sets or other data for a certain set of resources (i.e., footprint) in the emulation system. Examples of such resources may include multiplexers, data arrays, and processing elements.

In a next step 803, the compiler determines which resources should receive instructions compiled from the netlist, thereby defining the footprint of resources that will execute the emulation. In some cases, the virtual logic comprises instructions that may be distributed to multiplexers and processing elements of the emulation system. In such cases, the compiler may identify which operations must be performed by the multiplexer or processing element, and then determine the most efficient location (i.e., multiplexer instruction memory) to place each operation. The compiler may determine which multiplexer or processing element should receive the instruction for an operation, and then determine which address in the multiplexer's or processing element's instruction memory the instruction should be placed.

Instructions may instruct the multiplexer to perform functions such as, selecting input data signals; what, if any, operations the multiplexer's crossbars should perform; and where to transmit any outputted data signals. The compiler may determine which resources of the emulation system are available to receive and execute an instruction set, or some other form of virtual logic. Availability and/or selection of resources may be determined in a number of ways; non-limiting examples of availability and/or selections of resources may include: based on whether a resource is already committed to executing instructions for a separate emulation; based on the set specified by an administrator or user; or based on if the resource is already committed to executing another aspect (e.g., different instruction set) of the present emulation. In some cases, the compiler may comprise software modules capable of determining the availability status for the various components of the emulation system, such as logic boards, logic chips, multiplexers, and data memories, among others, as well as instruction storage components. In some cases, the compiler may comprise software modules that query a resource index database, which may store an availability status for each of the components of the emulation system.

In a next step 805, after the compiler determines which resources should receive instruction sets, the compiler then generates the instructions of those instruction sets. That is, the compiler may compile the logical gates of the netlist file into instructions for the predetermined resources. The set of resources identified as being available then impacts how the compiler prepares each particular portion of the virtual logic. The netlist file may be compiled into virtual logic with the expectation that the resulting instructions will be executed by the predetermined set of resources. The instructions generated for each resource instruct that resource to perform various tasks, such as select data signal inputs from a given data lane, based on that resource's relative location within the emulation system. Thus, the netlist file is compiled for a particular footprint of predetermined resources expected to receive and execute designated portions of the virtual logic.

In a next step 807, after generating the instruction sets, the emulation system may populate an instruction database that stores the instructions and other data of a virtual logic file. The instruction database may store any number of emulation virtual logic files, or individual instruction sets. In some cases, automated or manual processes may instruct the database to distribute the instruction sets to the resources; and in some cases, automated or manual processes may instruct the resources to download or otherwise fetch the instructions.

After compilation time A, i.e., when the netlist file is compiled into virtual logic containing instructions for resources of the emulation system, the emulation system may then proceed to download time B. Download time A may include manual and/or automated processes associated with distributing compiled instructions to the appropriate instruction memories of a footprint. In some implementations, the emulation system may automatically proceed from compilation time A to download time B; and in some implementations, the emulation system may await a user command or some predetermined triggering event, before proceeding to download time B.

In a next step 809, after the instruction database has been populated, software modules of the emulation system may check the availability of the resources in the footprint before providing the dedicated instruction sets to those resources. In some embodiments, the emulation system may have a configuration manager software module that is executed by a computing device communicatively coupled to the resources of the emulation system. The configuration manager module may be a software module that may be executed during download time B, runtime C, or may always be running for a particular emulator system. The configuration manager monitors the status of resources of the emulation system, such as memories, processors, clusters, lanes, chips, boards, and other components. After compilation time A, but prior to download time B, the configuration manager may determine how to distribute the compiled virtual logic to the resources of the system—regardless of which resources the instruction sets were compiled for—with the goal of each instruction set only being downloaded to a resource that is currently available. In some embodiments, the emulation system may allocate resources for a number of emulations, so that the emulation system may execute multiple emulations simultaneously. In such embodiments, there are occasions where resources are allocated to another emulation effort, even after the compiler generated an instruction set for those now-allocated resources. Consequently, these allocated resources are unavailable for the ongoing process 800. The configuration manager may be configured to determine whether the resources (e.g., emulation chips, logic boards, multiplexers, data array memories) of the footprint defined by the compiled instruction set are available to receive their respective instruction sets.

In some embodiments, the configuration manager may be configured to dynamically determine which resources are available based on an allocation status detected by the configuration manager or reported by the particular resource. The allocation status data may contain data useful for determining whether the resource may receive and execute instructions; non-limiting examples of such data may include an instruction memory status (e.g., memory is full) and a resource execution status (e.g., busy, idle), among other possible data. In some embodiments, the configuration manager may consult a resource index database containing the status of the resources in the emulation system.

In some cases, the configuration manager may be configured to dynamically update the allocation status of resources in the resource index. Additionally or alternatively, the records of the resource index database may indicate an availability status of the resources of the emulation system. The availability status may be a data field indicating whether the resource is available to receive instructions. In cases where the availability status is an additional field to the allocation status, the availability status may indicate other types of data relating to the resource's availability (e.g., broken, missing, non-operational, not compatible). In cases where the availability status is an alternative data field to the allocation status, then the availability status may contain the data indicating the allocation status of a resource and the other types of data relating to the resource's availability.

If the configuration manager determines resources in the footprint are unavailable, then the configuration manager may command an instruction and configuration process to execute relocation steps 811, 813 to mitigate the problem. In conventional systems, when resources are unavailable post-compilation and another suitable congruent footprint is not available, the instruction sets need to be recompiled for available resources. This can be costly and time-consuming because logic systems could comprise many millions, or even billions, of gates, which means that compiling the logic system's netlist file could take several more hours. The configuration manager may trigger execution of relocation steps 811, 813, to relocate resources previously determined to execute some of the compiled instruction sets, thereby redefining the boundaries of the footprint.

In a next step 811, after determining resources of the footprint are unavailable, the configuration manager may then determine which similar resources in the emulation system are unavailable and which similar resources are available. As a result, the configuration manager may determine the boundaries of a revised footprint.

In a next step 813, after determining which substitute resources should receive the instruction sets compiled for unavailable resources, the system may revise the instructions of the instruction sets compiled for the unavailable resources. Revisions may include moving, transforming, or rewriting portions of the compiled instruction sets, depending upon the relationship between the resources of the compiled footprint and the revised footprint.

For example, when an emulation chip is unavailable, the instruction sets for the processor may be moved to the next available chip. The input and output instructions for that chip may need to be transformed to accommodate the change. Likewise, the instruction sets for the IMUX and OMUX related to the original and substitute chip must be revised as well, to accommodate for the new resource mapping in the input and output instruction fields. In some embodiments, the IMUX may have a full crossbar multiplexer, which means that the IMUX may be capable of merely receiving and execute changed (i.e., transformed) instructions that accommodate for a new select input from the serial bus and/or a new output destination on the data lanes. That is, IMUX instruction sets may be transformed to accommodate shifts in where the IMUX is expected to send and receive data signals, but often the IMUX instructions do not need to move to a new IMUX. The IMUX instructions merely need to be revised (i.e., change instruction parameters) to select correct inputs and outputs across the IMUX's full crossbar. In some embodiments, the OMUX may have a partial crossbar multiplexer, which means that the OMUX instructions may need to move to a new memory address, new OMUX, or an altogether different emulation chip may need to be selected. However, after the OMUX instructions are moved is may not be necessary to transform the parameters of the instructions. The OMUX may already be configured to transmit data it receives to certain destinations, which could be the same regardless of whether the inputs change. In some cases, however, the OMUX instructions may need to be transformed to accommodate a new mapping, to select a correct input. Conversely, if the destination to which an OMUX instruction is sending data is related, the OMUX instruction may be transformed to transmit the data to the new destination resource to replace the old destination resource. In some implementations, the configuration manager may make these revisions to the instruction sets while they are stored in the instruction database. And, in some implementations, these revisions may be made as the instructions are being downloaded to the respective resources.

In a next step 815, after revising (i.e., moving, transforming) instruction sets as needed, the emulation system may then download the compiled or revised instructions into the memories of the resources that are in the compiled or revised footprint. In some implementations, the configuration manager or other runtime module may transmit (i.e., push) the respective instructions to appropriate resources. In some implementations, software modules managing the resources may be configured to pull (i.e., fetch,) the respective instruction sets.

After download time B, the emulation system may proceed to runtime C. At runtime C, the emulation system enters a state of execution, i.e., when the emulator performs the emulation of the particular ASIC, or other logic system.

In a next step 817, the emulation system may execute the emulation, according to the compiled or revised footprint.

Figure 9:
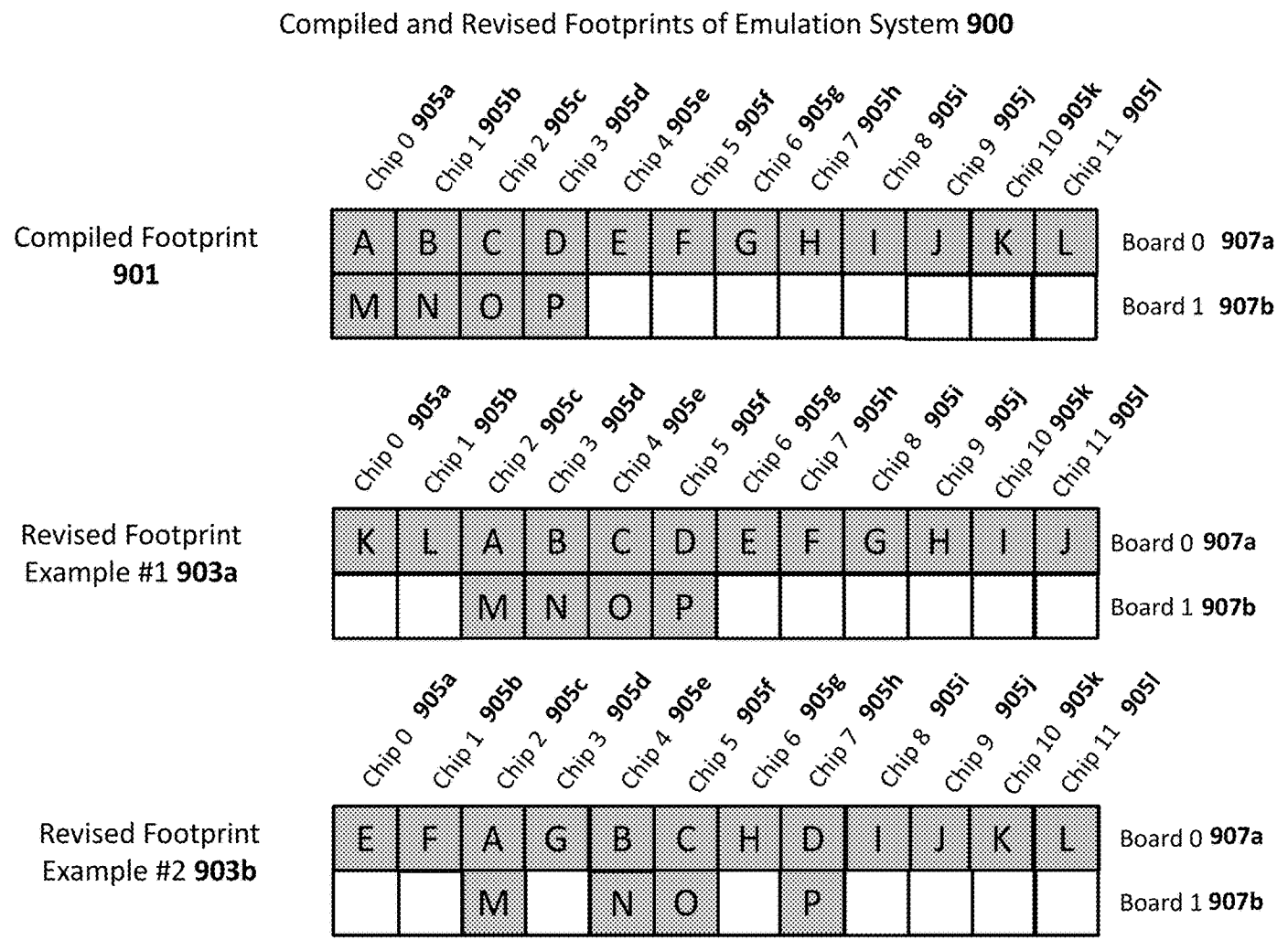

FIG. 9 shows schematic diagrams of possible footprints 901, 903 of resources 905, 907 of an emulation system 900 that will be used to emulate a logic system (e.g., ASIC, CPU, GPU) being tested, according to an exemplary embodiment. In this embodiment, a compiler has previously generated instruction sets A-P for multiplexers and/or other resources (e.g., chips 905, logic boards 907, data array memories) of the emulation system 900. These compiled instruction sets A-P may contain input and output instructions that are mapped to other resources. The resulting set of resources mapped to instructions in the various instruction sets A-P may define the logical boundaries of a compiled footprint 901. As previously mentioned, in some cases, automated or manual processes may trigger relocation or reconfiguration of the compiled footprint 901, as it is defined by the compiled instruction sets. In such cases, the automated or manual processes may generate revised footprints 903, where different chips 905 and/or different logic boards 907 may then receive the revised instruction sets A-P.

Fault Tolerance and Marking-Out System Components

As mentioned previously, a configuration manager may determine the allocation status of various resources in an emulation system. In addition to generally identifying which components are available to receive and execute certain instruction sets based on whether the resources are allocated to other emulation executions, the configuration manager may, in some embodiments, dynamically adapt complied instruction sets configured for failed hardware components (i.e., unavailable resources).

In such embodiments, the configuration manager may remain aware of which resources of the emulation system are broken, ineffective, or occupied, by consistently updating and querying a resource index database or mark-out list. The resource index database may be a database or marked-out list may be hosted in non-transitory machine-readable storage media of one or more computing devices of the emulation system, where the computing device hosting the compiler module, configuration module, resource index database, and marked-out list may be the same or different computing devices. The records of the resource index database may contain availability status data about each of the components of the emulation system. The availability status data may be found in one or more data fields of these records, and may include data such as whether the component is allocated, busy, broken, incompatible, idle, or otherwise unavailable to receive and execute instructions. The records of a marked-out list may indicate components of the emulation system that are broken or otherwise unavailable.

In some embodiments, the resource index database and the configuration manager may track the status of components associated with the resources intended to receive instructions, which may include data lanes, serial buses, data array memories, and other components of an emulation chip or logical board. The resource index database may contain records for such components, which may be continuously updated. Records of the resource index database may also contain data fields indicating the relationship between components. For example, a processor may be available but the data lanes leading from that processor an OMUX may be severed. In this example, the records for the processor and the data lanes may indicate the relationship between the components, i.e., that the processor is coupled to an OMUX through several broken data lanes. The configuration manager may dynamically determine that the processor is associated with broken components (i.e., data lanes) and then determine how the instructions of the processor may be transformed to account for the broken data lanes. In some cases, the system may enforce a fault tolerance threshold, which may cap the amount of transformations that the configuration manager may perform when accounting for faulty hardware.

In some embodiments, the configuration manager may determine that there are no available resources for transformation, and thus the emulation execution fails. For example, the configuration manager would know, from a resource index database, a logic board comprises eight chips (chips 0-7), but that, currently, chip 5 of board B is marked-out (i.e., broken). So in this example, the configuration manager would determine that executing the emulation job would not be possible if the system tries to execute an eight chip emulation job; under these circumstance, the configuration manager would prevent the emulation job from executing. On the other hand, if there were a seven-chip emulation job, the configuration manager may be able to make determinations on how to execute.

As another example, the system may compile for two full logic boards of seven chips, instead of eight chips. The system may relocate the footprint because chip 4 is determined to be broken on board A, and chip 5 is determined to be broken on board B. Because the system compiled for only 7 chips per board, the system may relocate the footprint by moving and/or transforming the instruction sets of several resources.

Figure 10:
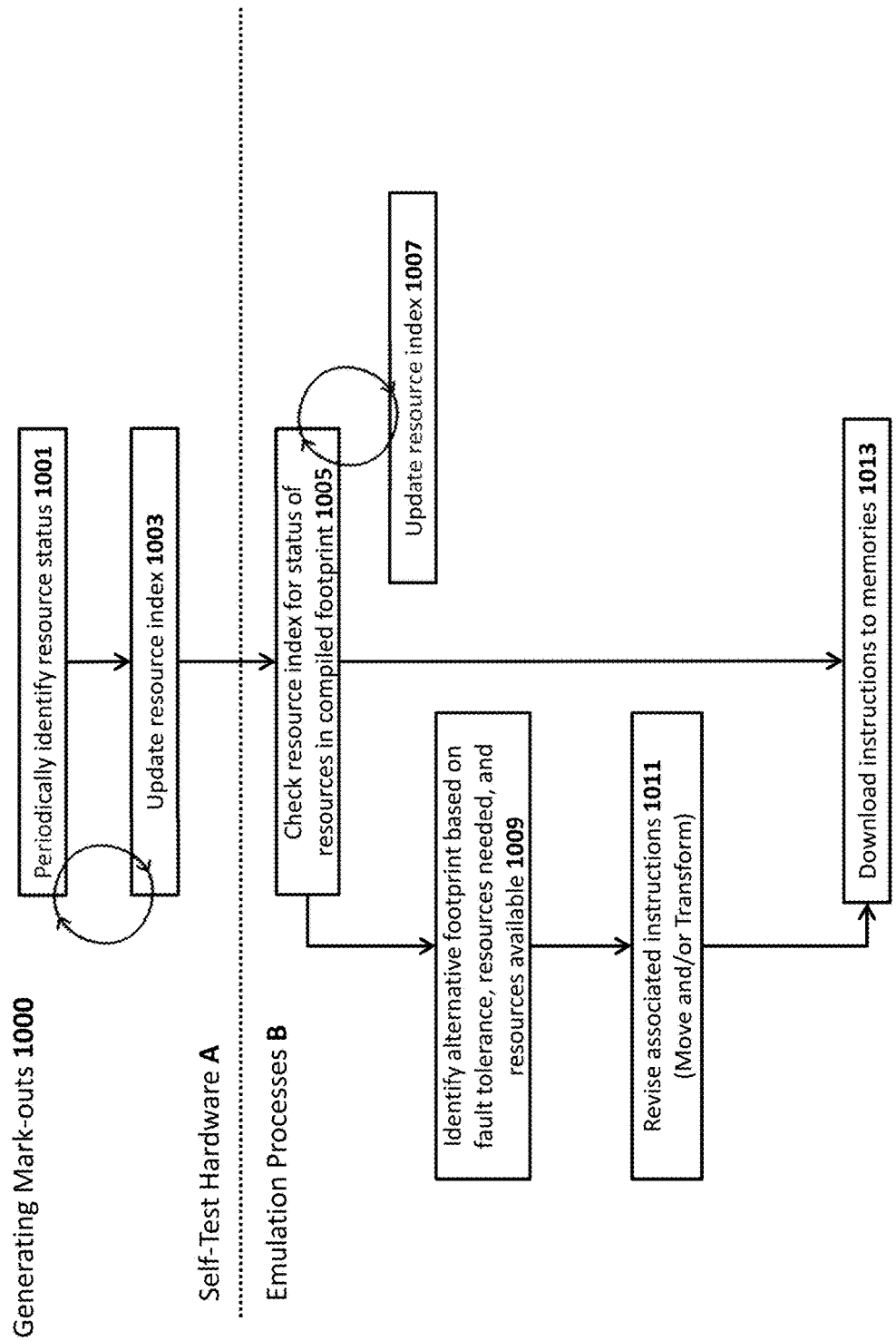
FIG. 10 shows execution of a process for tracking faults and fault tolerance, according to an exemplary embodiment.

FIG. 10 shows execution of a process 1000 for tracking faults and fault tolerance, according to an exemplary embodiment. The exemplary process 1000 may be segmented into ongoing hardware self-test A and the emulation processes B.

In a first step 1001, a configuration manager or other software module may continuously test or poll resources of the system at a periodic time. The configuration module may keep track of all the resources that are allocable and the associated components. The records of a resource index database or marked-out list may indicate whether the components are currently allocated or not. In addition to resources of emulation chips, the configuration manager may also track components, such as data lanes and SerDes lanes. As such, in some embodiments, the emulation system may mark out a single lane and then adjust compiled instruction sets accordingly, whereas conventional systems that are unable to relocate a compiled foot print may have to mark out a whole chip or logic board, and then recompile.

In a next step 1003, the configuration manager may update the records of the resource index database or marked-out list to reflect the availability status and/or allocation status of each of the resources. In some embodiments, a user may manually indicate the status of a resource, and thus manually manipulate the availability status for one or more resources in the records of the database or marked-out list.

At the start of emulation processes B, the configuration manager may receive compiled instructions that define a compiled footprint, or the configuration manager may be instructed to review an instruction database comprising the compiled instructions.

In a next step 1005, the configuration manager may inspect the compiled instructions to identify the resources and related components defining the compiled footprint. The configuration manager may then query the resource index database or marked-out list to determine the status of each of the resources and related components. In some cases, the configuration manager may execute an optional step 1007, where the configuration manager may identify a change in the status of one or more resources from what is reflected in the resource index database or marked-out list. In these embodiments performing the optional step 1007, the configuration manager may update the resource index database or marked-out list accordingly. In some embodiments, a user may manually indicate the status of a resource, and thus manually manipulate the availability status for one or more resources in the records of the database or marked-out list. Where the change in status indicates that a resource previously indicated as unavailable or marked-out is now available, the system may proceed to a next step 1013.

In a next step 1009, if the configuration manager determines that one or more resources or related components of the compiled footprint render allocable resources unavailable to receive instructions, then the configuration manager may determine an alternative footprint or set of resources. In some cases, the configuration manager may be configured to determine whether the number mark-outs exceed a fault tolerance threshold. That is, the fault tolerance threshold for the number of marked-out data lanes may be one faulty data lane. However, this may be exceeded when there two data lanes. If two data lanes are faulty, then the quality of performance may be hindered if the emulation system has to transform portions of the instruction sets to account for the mark-outs, and thus the fault tolerance may be administratively set at one data lane per processor. Moreover, prior to transforming the instructions sets to account for mark-outs, the configuration manager must first determine whether there are suitable alternatives available in the system. For example, if there are two faulty data lanes, then fault tolerant transformation would not be possible if the transformation would require more resources than what exists or is available in the emulation system.

Table 1 shows an example of possible fault tolerant thresholds and possible remapping solutions when transforming or moving instruction sets.

| Fault Tolerance Thresholds | Compilation Overview | Remapping Example |
|---|---|---|
| Tolerate 1/6 bad lanes, for each set of chip-to-chip data lanes board. | Compiler compiles for only 5 of 6 possible connections between each chip pairing on the logic | Compile for lanes [0:4] can be run in lanes [0:2, 4:5]. A faulty lane can be avoided, because there is an extra lane available. |
| Tolerate 1/12 faulty chips per board | Compiler compiles for 11 of the 12 chips in aboard | Compile for chips C[0:10] can be loaded into C[0:4, 6:11] |
| Tolerate 1/6 faulty boards per cluster | Compiler compiles for 5 of 6 of the board in a cluster | Compile for boards B[0:4] can be loaded into B[0:2, 4:5] | status of each of the resources. In some embodiments, a user may manually indicate the status of a resource, and thus manually manipulate the availability status for one or more resources in the records of the database or marked-out list.

In a next step 1011, the configuration manager may revise (e.g., move, transform) the instruction sets based on the identified resources from a previous step 1009. After revising the instruction sets, then, in a next step 1013, the configuration manager may trigger download of the instruction sets to the appropriate resources.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A processor-implemented method for emulating programmatic logic of an integrated circuit design that has been compiled into a compiled set of instructions for a first emulation processor of a compiled footprint of emulation resources of an emulation system configured to emulate the integrated circuit design, the compiled footprint defined by the emulation resources for which a compiler compiled the programmatic logic, the method comprising:
   determining, by a configuration manager, that the first emulation processor is unavailable to execute the compiled set of instructions, the compiled set of instructions comprising a plurality of instructions having a plurality of parameter values and compiled at the compiler for the first emulation processor;
   identifying, by the configuration manager, a second emulation processor of the emulation system that is available to execute the compiled set of instructions according to a status indicator for the second emulation processor in a resource database, wherein the second processor is outside of the compiled footprint;
   without recompiling the compiled set of instructions, revising, by the configuration manager, one or more parameter values in the plurality of instructions of the compiled set of instructions, thereby generating a revised compiled set of instructions comprising one or more revised parameter values in the plurality of instructions, the one or more revised parameter values including a first revised parameter value indicating a destination processor;

receiving, by the second emulation processor of the emulation system, from the configuration manager the revised compiled set of instructions associated with the integrated circuit design;

executing, by the second emulation processor of the emulation system, a first instruction in the revised compiled set of instructions according to the one or more revised parameter values of the first instruction; and transmitting, by the second emulation processor during the runtime of the emulation system, an output bit generated by executing the first instruction, the output bit transmitted to the destination processor according to the first parameter value of the first instruction.

2. The method according to claim 1, further comprising selecting, by the second emulation processor, an input bit from a plurality of input bits received by the second emulation processor, according to a second revised parameter value in the first instruction indicating an input source.

3. The method according to claim 2, wherein, after compilation, a second parameter value is changed based on the second emulation processor to generate the second changed parameter value.

4. The method according to claim 1, further comprising storing, by the second emulation processor, the revised compiled set of instructions into an instruction memory coupled to the second emulation processor.

5. The method according to claim 1, wherein transmitting the output bit to the destination processor further comprises:

transmitting, by the second emulation processor, the output bit to a logical board comprising the destination processor, according to the one or more changed parameter values.

6. The method according to claim 1, wherein a parameter value in an instruction is selected from the group consisting of:

an indication of an input bit, an indication of a logical operation, and an indication of the destination processor, an indication of a destination logical board.

7. The method according to claim 1, wherein the second emulation processor is housed on a first emulation circuit of the emulation system, and is coupled to an output multiplexer configured to selectively transmit one or more output bits to one or more destination processors housed on one or more emulation circuits, and wherein the output multiplexer transmits the output bit from the second emulation processor to the destination processor, when the destination processor is located on a second emulation circuit of the emulation system.

8. The method according to claim 7, wherein the output multiplexer is configured as a partial crossbar configured to change a data lane of the first emulation circuit configured to transmit the output bit according to the one or more revised parameter values of the revised compiled set of instructions.

9. The method according to claim 1, wherein the second emulation processor is housed on a first emulation circuit of the emulation system, and is coupled to an input multiplexer configured to selectively transmit one or more input bits to one or more processors housed on the first emulation circuit, and wherein the input multiplexer transmits an input bit to the second emulation processor from a source processor located on a second emulation circuit of the emulation system.

10. The method according to claim 9, wherein the input multiplexer is configured as a full crossbar configured to change a data lane of the first emulation circuit configured to transmit the input bit from the second emulation circuit according to the one or more revised parameter values of the revised compiled set of instructions.

11. A processor-implemented method for emulating programmatic logic of an integrated circuit design compiled into a compiled set of instructions for a first emulation processor of a compiled footprint of emulation resources of an emulation system configured to emulate the integrated circuit design, the compiled footprint defined by the emulation resources for which a compiler compiled the programmatic logic, the method comprising:

determining, by a configuration manager, that the first emulation processor is unavailable to execute the compiled set of instructions, the compiled set of instructions comprising a plurality of instructions having a plurality of parameter values and compiled at the compiler for the first emulation processor;

identifying, by the configuration manager, a second emulation processor of the emulation system that is available to execute the compiled set of instructions according to a status indicator for the second emulation processor in a resource database, wherein the second processor is outside of the compiled footprint;

without recompiling the compiled set of instructions, revising, by the configuration manager, one or more parameter values in the plurality of instructions of the compiled set of instructions, thereby generating a revised compiled set of instructions comprising one or more revised parameter values in the plurality of instructions, the one or more revised parameter values including a first revised parameter value indicating an input source;

receiving, by the second emulation processor of the emulation system, from the configuration manager the revised compiled set of instructions associated with the integrated circuit design;

selecting, by the second emulation processor, according to the first revised parameter value of a first instruction, an input bit from a plurality of inputs received by the second emulation processor;

executing, by the second emulation processor, the first instruction in the revised compiled set of instructions according to the one or more changed parameter values of the first instruction; and transmitting, by the second emulation processor during the runtime of the emulation system, an output bit generated by executing the first instruction, the output bit transmitted to a destination processor.

12. The method according to claim 11, further comprising:

transmitting, by the second emulation processor, the output bit to the destination processor according to a second revised parameter value of the first instruction indicating the destination processor.

13. The method according to claim 12, wherein, after compilation, a second parameter value is revised to generate the second revised parameter value based upon the second emulation processor.

14. The method according to claim 11, wherein the second emulation processor is housed on a first emulation circuit of the emulation system, and is coupled to an output multiplexer configured to selectively transmit one or more output bits to one or more destination processors housed on one or more emulation circuits, and wherein the output multiplexer transmits the output bit from the second emulation processor to the destination processor when the destination processor is located on a second emulation circuit of the emulation system.

15. The method according to claim 14, wherein the output multiplexer is configured as a partial crossbar configured to change a data lane of the first emulation circuit configured to transmit the output bit according to the one or more revised parameter values of the revised compiled set of instructions.

16. The method according to claim 11, wherein the second emulation processor is housed on a first emulation circuit of the emulation system, and is coupled to an input multiplexer configured to selectively transmit one or more input bits to one or more processors housed on the first emulation circuit, and wherein the input multiplexer transmits an input bit to the second emulation processor from a source processor located on a second emulation circuit of the emulation system.

17. The method according to claim 16, wherein the input multiplexer is configured as a full crossbar configured to change a data lane of the first emulation circuit configured to transmit the input bit from the second emulation circuit according to the one or more revised parameter values of the revised compiled set of instructions.

18. A circuit emulation system comprising:
at least two emulation processing circuits, each respective emulation processing circuit comprising:
a plurality of clusters of a plurality of processors, each respective processor comprising a logic function multiplexer coupled to a processor instruction store configured to store a set of processor instructions;
a first multiplexer including a first instruction store configured to store a set of first instructions, the first multiplexer in electrical communication with each cluster of the emulation processing circuits, and configured to route data from a first cluster to a second processor, based upon a first instruction in the first instruction store; and
a second multiplexer including a second instruction store configured to store a set of second instructions, the second multiplexer in electrical communication with the first cluster and configured to route data to a third processor based upon a second instruction in the second instruction store, the third processor in a second emulation processing circuit of the at least two emulation processing circuits; and
a third multiplexer including a third instruction store configured to store third instructions, the third multiplexer in electrical communication with one or more processors of the respective emulation processing circuit, the third multiplexer configured to receive from at least one other emulation processing circuit a plurality of data inputs containing data, and based upon a third instruction: select a data input and route the data to the one or more processors of the emulation processing circuit coupled to the third multiplexer.

19. The system according to claim 18, the emulation processing circuit further comprising:
a serial bus in electrical communication with the second multiplexer and the third multiplexer, the serial bus configured to host serialized data transmitted between the least two emulation processing circuits,
wherein the second multiplexer is configured to transmit the data being routed over the serial bus to the second processing circuit, and wherein the third multiplexer is configured to receive over the serialization bus at least one data input from at least one cluster on the second emulation processing circuit.

20. The system according to claim 18, at least one of the clusters further comprising:
a data memory comprising non-transitory machine-readable storage memory communicatively coupled to the logic function multiplexer, the data memory configured to provide data to the logic function multiplexer based upon a processor instruction, and update data stored in the data array based on the data received from the logic function multiplexer.

21. The system according to claim 20, wherein the data memory is communicatively coupled to the third multiplexer, and
wherein the data memory is further configured to store data received from the third multiplexer, and update the data stored in the data array based on the data received from the third multiplexer.

22. The system according to claim 18, the emulation system further comprising a compiler module executed by at least one computing device, the compiler module configured to generate each of the instruction sets for each of the at least two emulation processing circuits,
wherein, upon compilation, each respective instruction set is configured for a destination multiplexer.

23. The system according to claim 22, further comprising a configuration module executed by at least one computing device, the configuration module configured to, subsequent to compilation, change the destination multiplexer for at least one of the instruction sets.

24. The system according to claim 22, further comprising a configuration manager executed by at least one computing device, the configuration module configured to, subsequent to compilation, change one or more parameter values of one or more instructions in at least one instruction set.

25. The system according to claim 22, further comprising a configuration manager executed by at least one computing device, the configuration module configured to, subsequent to compilation, identify a second destination multiplexer for at least one of the instructions sets.

26. The system according to claim 18, the system further comprising one or more logical boards, each logical board comprising at least one emulation processing circuit.

27. The system according to claim 18, wherein the second multiplexer is configured as a partial-crossbar that selectively transmits an output bit produced by the first cluster to the third processor of the second emulation circuit, and transmits the output bit according to a data lane configured to transmit the output bit to the third processor of the second emulation circuit.

28. The system according to claim 27, wherein the second multiplexer is coupled to a plurality of data lanes of the first emulation circuit, and is further configured to selectively transmit one or more output data bits to one or more destination processors of the emulation system via the plurality of data lanes, and
wherein the second multiplexer transmits the output bit to the third processor via a group of the data lanes dedicated to conveying the data bit to the third processor.

29. The system according to claim 18, wherein the third multiplexer is configured as a full crossbar configured to dynamically route one or more input bits received from a plurality of source processors housed on one or more source emulation circuits to one or more processors housed on the first emulation circuit, and wherein the third multiplexer transmits an input bit to a fourth processor that is housed on the first emulation circuit according to the third instructions.

30. The system according to claim 29, wherein the first emulation circuit includes N processors and M input data lanes, and wherein the full crossbar of the third multiplexer is further configured to transmit the one or more input data bits to any of the N processors via any of the M input data lanes in accordance with the third instructions.

\* \* \* \* \*